US011982728B2

United States Patent
Ye

(10) Patent No.: US 11,982,728 B2
(45) Date of Patent: May 14, 2024

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventor: Yongquan Ye, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 269 days.

(21) Appl. No.: 17/651,416

(22) Filed: Feb. 16, 2022

(65) Prior Publication Data

US 2023/0314543 A1    Oct. 5, 2023

(51) Int. Cl.
   *G01R 33/565*    (2006.01)
   *G01R 33/56*    (2006.01)
(52) U.S. Cl.
   CPC ... *G01R 33/56536* (2013.01); *G01R 33/5602* (2013.01); *G01R 33/5608* (2013.01)
(58) Field of Classification Search
   None
   See application file for complete search history.

(56) References Cited

U.S. PATENT DOCUMENTS

| 4,734,646 A * | 3/1988 | Shenoy | G01R 33/50 324/309 |
| 8,324,898 B2 * | 12/2012 | Sung | A61B 5/055 324/309 |
| 9,588,205 B2 | 3/2017 | Remmele et al. | |
| 10,935,617 B2 | 3/2021 | Keupp et al. | |
| 11,047,942 B2 | 6/2021 | Wang | |
| 2017/0027472 A1 | 2/2017 | Gdaniec et al. | |
| 2020/0146635 A1* | 5/2020 | Wang | G06T 7/38 |
| 2020/0303049 A1 | 9/2020 | Zhang et al. | |
| 2022/0283255 A1* | 9/2022 | Takei | G01R 33/5602 |

FOREIGN PATENT DOCUMENTS

| WO | 2015110909 A1 | 7/2015 |
| WO | 2017192557 A1 | 11/2017 |
| WO | 2018109086 A1 | 6/2018 |

OTHER PUBLICATIONS

Fahmi Khalifa et al., Models and Methods for Analyzing DCE-MRI: A Review, Medical Physics, 2014, 32pages.

(Continued)

*Primary Examiner* — Rodney E Fuller
(74) *Attorney, Agent, or Firm* — METIS IP LLC

(57) ABSTRACT

A method for magnetic resonance imaging (MRI) may include obtaining a plurality of first magnetic resonance (MR) data sets related to a region of interest (ROI) of a subject. The plurality of first MR data sets may be collected based on two or more different values of a scan parameter. The method may also include determining a plurality of second MR data sets based on the plurality of first MR data sets. Each of the plurality of second MR data sets may correspond to at least two of the plurality of first MR data sets. The method may also include generate, based on the plurality of second MR data sets, a plurality of T1 weighted images of the ROI each of which corresponds to a target time point.

20 Claims, 10 Drawing Sheets

(56) References Cited

OTHER PUBLICATIONS

Schabel, Matthias C et al., Uncertainty and Bias in Contrast Concentration Measurements Using Spoiled Gradient Echo Pulse Sequences, Physics in medicine & biology, 53(9): 2345-2373, 2008.
Ye, Yongquan et al., A Multi-Dimensional Integration (MDI) Strategy for MR T2 Mapping, NMR in biomedicine, 2021, 13 pages.
Cheng, Hai-Ling Margaret, T1 Measurement of Flowing Blood and Arterial Input Function Determination for Quantitative 3D T1-weighted DCE-MRI, Journal of Magnetic Resonance Imaging, 25(5): 1073-1078, 2007.
Deoni, Sean C. L et al., Rapid Combined T1 and T2 Mapping Using Gradient Recalled Acquisition in the Steady State, Magnetic Resonance in Medicine, 49(3): 515-526, 2003.
Rockers, Elijah D et al., Quantitative Analysis of 3D T1-Weighted Gadolinium (Gd) DCE-MRI with Different Repetition Times, Lecture Notes in Computer Science (including subseries Lecture Notes in Artificial Intelligence and Lecture Notes in Bioinformatics), 2016, 12 pages.
Ye, Yongquan et al., Augmented T1 Weighted (aT1W) Contrast Imaging, Proceedings 29th Scientific Meeting, International Society for Magnetic Resonance in Medicine, 2021, 3 pages.
Deoni, Sean C.L, High-resolution T1 Mapping of the Brain at 3T with Driven Equilibrium Single Pulse Observation of T1 with High-speed Incorporation of RF Field Inhomogeneities (DESPOT1-HIFI), Journal of Magnetic Resonance Imaging, 26(4): 1106-1111, 2007.
Bokacheva, Louisa et al., Quantitative Determination of Gd-DTPA Concentration in T1-Weighted MR Renography Studies, Magnetic resonance in medicine, 57(6): 1012-1018, 2007.

\* cited by examiner

600

┌─────────────────────────────────────────────────────────────┐
│ Obtaining a plurality of first magnetic resonance (MR) data sets │ 610
│ related to a region of interest (ROI) of a subject, the plurality of │
│ first MR data sets being collected based on two or more values │
│ of a scan parameter │
└─────────────────────────────────────────────────────────────┘
                                │
                                ▼
┌─────────────────────────────────────────────────────────────┐
│ Determining a plurality of second MR data sets based on the │ 620
│ plurality of first MR data sets, each of the plurality of second │
│ MR data sets corresponding to at least two of the plurality of │
│ first MR data sets │
└─────────────────────────────────────────────────────────────┘
                                │
                                ▼
┌─────────────────────────────────────────────────────────────┐
│ Generating, based on the plurality of second MR data sets, a │ 630
│ plurality of T1 weighted images of the ROI each of which │
│ corresponds to a target time point │
└─────────────────────────────────────────────────────────────┘

SYSTEMS AND METHODS FOR MAGNETIC RESONANCE IMAGING

TECHNICAL FIELD

This disclosure generally relates to magnetic resonance imaging (MRI), and more particularly, relates to systems and methods for T1 weighted dynamic imaging.

BACKGROUND

In T1 weighted dynamic imaging, besides T1 information, acquired magnetic resonance (MR) signals also include non-T1 factors, such as proton density, T2* relaxation effect, and receiving coil sensitivity, etc., which may introduce errors and biases to signal analysis, e.g., image reconstruction, physiological analysis, etc. Therefore, it is desirable to provide systems and methods for T1 weighted dynamic imaging to alleviate or eliminate the effect of non-T1 factors on T1 weighted dynamic imaging.

SUMMARY

According to an aspect of the present disclosure, a system for magnetic resonance imaging (MRI) may include one or more storage devices and one or more processors configured to communicate with the one or more storage devices. The one or more storage devices may include a set of instructions. When the one or more processors executing the set of instructions, the one or more processors may be directed to perform one or more of the following operations. The one or more processors may obtain a plurality of first magnetic resonance (MR) data sets related to a region of interest (ROI) of a subject. The plurality of first MR data sets may be collected based on two or more different values of a scan parameter. The one or more processors may determine a plurality of second MR data sets based on the plurality of first MR data sets. Each of the plurality of second MR data sets may correspond to at least two of the plurality of first MR data sets. The one or more processors may generate, based on the plurality of second MR data sets, a plurality of T1 weighted images of the ROI each of which corresponds to a target time point. According to another aspect of the present disclosure, a method for magnetic resonance imaging (MRI) may include one or more of the following operations. One or more processors may obtain a plurality of first magnetic resonance (MR) data sets related to a region of interest (ROI) of a subject. The plurality of first MR data sets may be collected based on two or more different values of a scan parameter. The one or more processors may determine a plurality of second MR data sets based on the plurality of first MR data sets. Each of the plurality of second MR data sets may correspond to at least two of the plurality of first MR data sets. The one or more processors may generate, based on the plurality of second MR data sets, a plurality of T1 weighted images of the ROI each of which corresponds to a target time point.

According to yet another aspect of the present disclosure, a system for magnetic resonance imaging (MRI) may include an acquisition module configured to obtain a plurality of first magnetic resonance (MR) data sets related to a region of interest (ROI) of a subject. The plurality of first MR data sets may be collected based on two or more different values of a scan parameter. The system may also include a determination module configured to determine a plurality of second MR data sets based on the plurality of first MR data sets. Each of the plurality of second MR data sets may correspond to at least two of the plurality of first MR data sets. The system may also include a reconstruction module configured to generate, based on the plurality of second MR data sets, a plurality of T1 weighted images of the ROI each of which corresponds to a target time point.

According to yet another aspect of the present disclosure, a non-transitory computer readable medium may comprise at least one set of instructions. The at least one set of instructions may be executed by one or more processors of a computer server. The one or more processors may obtain a plurality of first magnetic resonance (MR) data sets related to a region of interest (ROI) of a subject. The plurality of first MR data sets may be collected based on two or more different values of a scan parameter. The one or more processors may determine a plurality of second MR data sets based on the plurality of first MR data sets. Each of the plurality of second MR data sets may correspond to at least two of the plurality of first MR data sets. The one or more processors may generate, based on the plurality of second MR data sets, a plurality of T1 weighted images of the ROI each of which corresponds to a target time point.

In some embodiments, the at least two of the plurality of first MR data sets corresponding to the each of the plurality of second MR data sets may correspond to two of the two or more different values of the scan parameter.

In some embodiments, to determine the plurality of second MR data sets based on the plurality of first MR data sets, for one of the plurality of second MR data sets, the one or more processors may obtain at least one first MR data set related to a first value of the scan parameter. The one or more processors may obtain at least one first MR data set related to a second value of the scan parameter. The one or more processors may perform division based on the at least two of the plurality of first MR data sets related to the first value and the second value of the scan parameter.

In some embodiments, each of the plurality of first MR data sets may be collected based on one of the two or more values of the scan parameter.

In some embodiments, the scan parameter may include at least one of a flip angle or a repetition time (TR).

In some embodiments, the plurality of first MR data sets may be collected based on two or more different values of the flip angle and a fixed value of the TR; two or more different values of the TR and a fixed value of the flip angle; or two or more different values of the flip angle and two or more different values of the TR. The plurality of first MR data sets may be collected so that any two adjacent first MR data sets correspond to different values of at least one of the flip angle or the TR.

In some embodiments, to determine the plurality of second MR data sets based on the plurality of first MR data sets, for each of the plurality of second MR data sets, the one or more processors may determine the second MR data set by performing division between two adjacent first MR data sets.

In some embodiments, the target time point of one of the plurality of T1 weighted images corresponding to the second MR data set may be designated as an average time point of a time period in which the two adjacent first MR data sets are acquired.

In some embodiments, the plurality of first MR data sets may be collected based on two or more different values of the flip angle and a fixed value of the TR; or two or more different values of the TR and a fixed value of the flip angle. At least one of the plurality of first MR data sets corresponding to a first value of the two or more values of the flip angle or the TR may be collected before the rest of the plurality of first MR data sets corresponding to the rest of the two or more values of the flip angle or the TR.

In some embodiments, the plurality of first MR data sets may be collected based on two or more different values of the flip angle and two or more different values of the TR. At least one of the plurality of first MR data sets corresponding to a first value of the two or more values of the flip angle and a first value of the two or more values of the TR may be collected before the rest of the plurality of first MR data sets corresponding to the rest of the two or more values of the flip angle and the rest of the two or more values of the TR.

In some embodiments, to determine the plurality of second MR data sets based on the plurality of first MR data sets, the one or more processors may determine an average of the at least one of the plurality of first MR data sets. For each of the plurality of second MR data sets, the one or more processors may determine the second MR data set by performing division between the average and one of the rest of the plurality of first MR data sets.

In some embodiments, the target time point of one of the plurality of T1 weighted images corresponding to the second MR data set is designated as a time point in a time period in which the one of the rest of the plurality of first MR data sets is acquired.

In some embodiments, at least one of the plurality of first MR data sets may be acquired before an injection of a contrast agent into the ROI, and the rest of the plurality of first MR data sets is acquired after the injection of the contrast agent.

In some embodiments, the one or more processors may perform T1 mapping based on the plurality of first MR data sets.

In some embodiments, the one or more processors may estimate a contrast agent concentration corresponding to each target time point based on the plurality of T1 weighted images and the T1 mapping. The one or more processors may perform physiological analysis of the ROI based on the contrast agent concentration corresponding to each target time point.

In some embodiments, the one or more processors may determine a signal intensity corresponding to each target time point based on the plurality of T1 weighted images. The one or more processors may perform physiological analysis of the ROI based on the signal intensity corresponding to each target time point.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 6 is a flowchart illustrating an exemplary process for generating a plurality of T1 weighted images according to some embodiments of the present disclosure;

DETAILED DESCRIPTION

Figure 1:
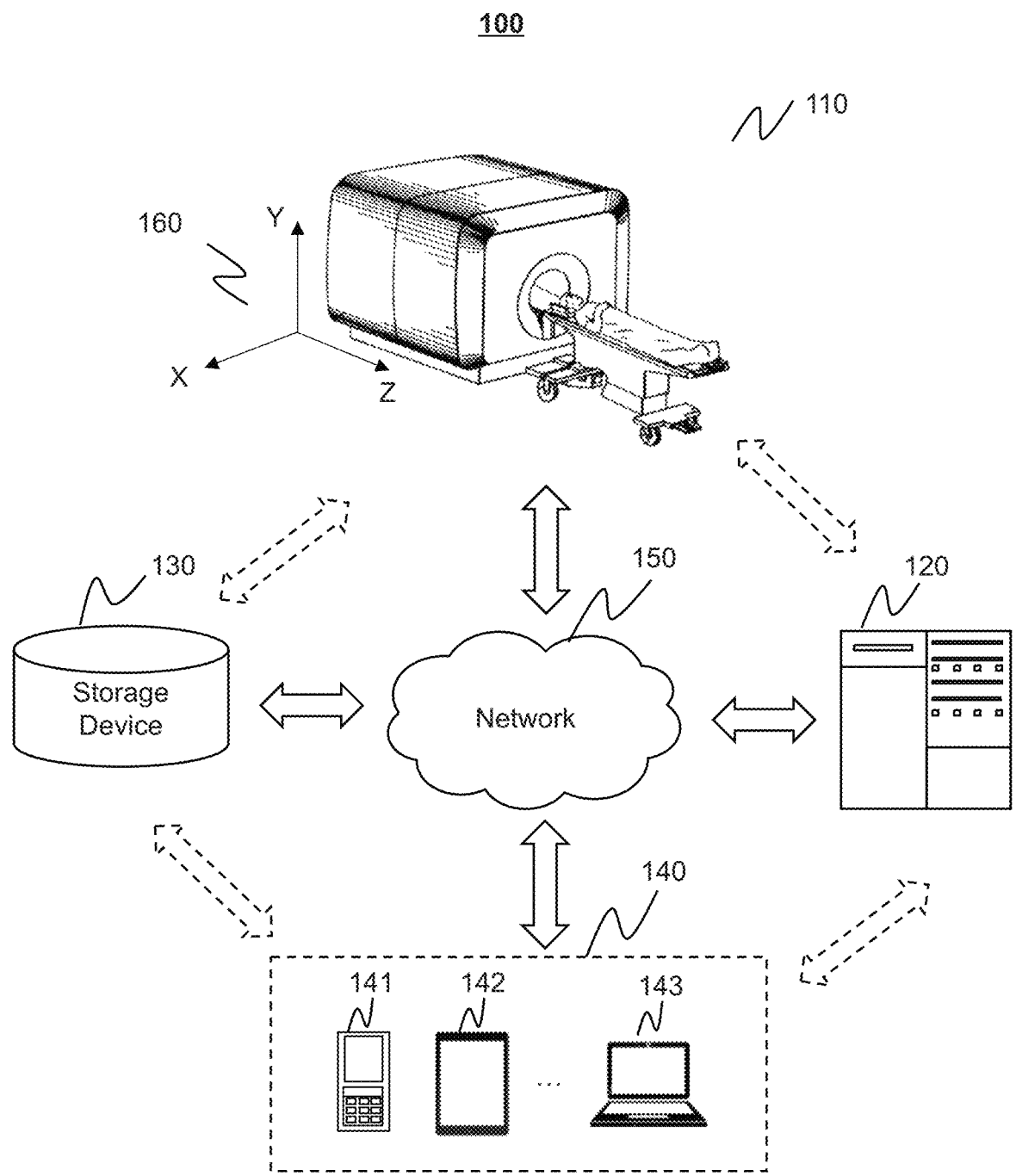
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

It will be understood that the terms "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

Spatial and functional relationships between elements are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent," etc.).

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for medical imaging and/or medical treatment. In some embodiments, the medical system may include an imaging system. The imaging system may include a single modality imaging system and/or a multi-modality imaging system. The single modality imaging system may include, for example, a magnetic resonance imaging (MRI) system. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc. In some embodiments, the medical system may include a treatment system. The treatment system may include a treatment plan system (TPS), image-guide radiotherapy (IGRT), etc. The image-guide radiotherapy (IGRT) may include a treatment device and an imaging device. The treatment device may include a linear accelerator, a cyclotron, a synchrotron, etc., configured to perform a radio therapy on a subject. The treatment device may include an accelerator of species of particles including, for example, photons, electrons, protons, or heavy ions. The imaging device may include an MRI scanner, a CT scanner (e.g., cone beam computed tomography (CBCT) scanner), a digital radiology (DR) scanner, an electronic portal imaging device (EPID), etc.

An aspect of the present disclosure relates to systems and methods for T1 weighted dynamic imaging. The systems and methods may obtain a plurality of first magnetic resonance (MR) data sets related to a region of interest (ROI) of a subject. The plurality of first MR data sets may be collected based on two or more values of a scan parameter (e.g., a flip angle and/or a repetition time (TR)). The systems and methods may determine a plurality of second MR data sets based on the plurality of first MR data sets. Each of the plurality of second MR data sets may be determined based on at least two of the plurality of first MR data sets that correspond to two different values of the scan parameter. For example, for each of the plurality of second MR data sets, at least one first MR data set related to a first value of the scan parameter may be obtained. At least one first MR data set related to a second value of the scan parameter may be obtained. A division operation may be performed based on the at least two of the plurality of first MR data sets related to the first value and the second value of the scan parameter. The systems and methods may generate, based on the plurality of second MR data sets, a plurality of T1 weighted images of the ROI each of which corresponds to a target time point.

In the plurality of first MR data sets, besides T1 information, there are also non-T1 factors (e.g., related to equilibrium magnetization), such as T2*, a receiving coil sensitivity, an echo time (TE), a proton density of the ROI etc., which may introduce errors and biases to signal analysis, e.g., image reconstruction, physiological analysis, etc.

By determining a second MR data set by performing division between at least two of the plurality of first MR data sets, the one or more non-T1 factors in the at least two of the plurality of first MR data sets may be offset, so that the one or more factors non-T1 have less effect on the plurality of second MR data sets than the plurality of first MR data sets, thereby resulting a stronger contrast in the T1 weighted images, and making the subsequent physiological analysis more accurate. In addition, because the interference of non-T1 factors are eliminated or alleviated in the plurality of second MR data sets, the plurality of second MR data sets may be more sensitive to the T1 shortening effect caused by the contrast agent. So low-dose contrast agent can be used to reduce the cost and the potential impact of the contrast agent on the human body.

FIG. 1 is a schematic diagram illustrating an exemplary MRI system 100 according to some embodiments of the present disclosure. As illustrated, an MRI system 100 may include an MRI device 110, a processing device 120, a storage device 130, a terminal 140, and a network 150. The components of the MRI system 100 may be connected in one or more of various ways. Merely by way of example, as illustrated in FIG. 1, the MRI device 110 may be connected to the processing device 120 directly as indicated by the bi-directional arrow in dotted lines linking the MRI device 110 and the processing device 120, or through the network 150. As another example, the storage device 130 may be connected to the MRI device 110 directly as indicated by the bi-directional arrow in dotted lines linking the MRI device 110 and the storage device 130, or through the network 150. As still another example, the terminal 140 may be connected to the processing device 120 directly as indicated by the bi-directional arrow in dotted lines linking the terminal 140 and the processing device 120, or through the network 150.

The MRI device 110 may be configured to scan a subject (or a part of the subject) to acquire image data, such as echo signals (also referred to as magnetic resonance (MR) data or MR signals) associated with the subject. For example, the MRI device 110 may detect a plurality of echo signals by applying an MRI pulse sequence on the subject. In some embodiments, the MRI device 110 may include, for example, a main magnet, a gradient coil (or also referred to as a spatial encoding coil), a radio frequency (RF) coil, etc., as described in connection with FIG. 2. In some embodiments, the MRI device 110 may be a permanent magnet MRI scanner, a superconducting electromagnet MRI scanner, a resistive electromagnet MRI scanner, etc., according to types of the main magnet. In some embodiments, the MRI device 110 may be a high-field MRI scanner, a mid-field MRI scanner, a low-field MRI scanner, etc., according to the intensity of the magnetic field.

The subject scanned by the MRI device 110 may be biological or non-biological. For example, the subject may include a patient, a man-made object, etc. As another example, the subject may include a specific portion, an organ, tissue, and/or a physical point of the patient. Merely by way of example, the subject may include the head, the brain, the neck, a body, a shoulder, an arm, the thorax, the heart, the stomach, a blood vessel, soft tissue, a knee, a foot, or the like, or any combination thereof.

For illustration purposes, a coordinate system 160 including an X-axis, a Y-axis, and a Z-axis may be provided in FIG. 1. The X-axis and the Z axis shown in FIG. 1 may be horizontal, and the Y-axis may be vertical. As illustrated, the positive X direction along the X-axis may be from the right side to the left side of the MRI device 110 seen from the direction facing the front of the MRI device 110; the positive Y direction along the Y-axis shown in FIG. 1 may be from the lower part to the upper part of the MRI device 110; the positive Z direction along the Z-axis shown in FIG. 1 may refer to a direction in which the subject is moved out of a detection region (or referred to as a bore) of the MRI device 110.

In some embodiments, the MRI device 110 may be directed to select an anatomical region (e.g., a slice or a volume) of the subject along a slice selection direction and scan the anatomical region to acquire a plurality of echo signals from the anatomical region. During the scan, spatial encoding within the anatomical region may be implemented by spatial encoding coils (e.g., an X coil, a Y coil, a Z coil) along a frequency encoding direction, a phase encoding direction, and a slice selection direction. The echo signals may be sampled and the corresponding sampled data may be stored into a k-space matrix for image reconstruction. For illustration purposes, the slice selection direction herein may correspond to the Z direction defined by the coordinate system 160 and a Kz direction in k-space; the phase encoding direction may correspond to the Y direction defined by the coordinate system 160 and a Ky direction in k-space; and the frequency encoding direction (also referred to as readout direction) may correspond to the X direction defined by the coordinate system 160 and a Kx direction in k-space. It should be noted that the slice selection direction, the phase encoding direction, and the frequency encoding direction may be modified according to actual needs, and the modification may do not depart the scope of the present disclosure. More description of the MRI device 110 may be found elsewhere in the present disclosure. See, e.g., FIG. 2 and the description thereof.

The processing device 120 may process data and/or information obtained from the MRI device 110, the storage device 130, and/or the terminal(s) 140. For example, the processing device 120 may obtain a plurality of first magnetic resonance (MR) data sets related to a region of interest (ROI) of a subject. The plurality of first MR data sets may be collected based on two or more values of a scan parameter. The processing device 120 may determine a plurality of second MR data sets based on the plurality of first MR data sets, each of the plurality of second MR data sets corresponding to at least two of the plurality of first MR data sets. The processing device 120 may generate, based on the plurality of second MR data sets, a plurality of T1 weighted images of the ROI each of which corresponds to a target time point. In some embodiments, the processing device 120 may be a single server or a server group. The server group may be centralized or distributed. In some embodiments, the processing device 120 may be local or remote. For example, the processing device 120 may access information and/or data from the MRI device 110, the storage device 130, and/or the terminal(s) 140 via the network 150. As another example, the processing device 120 may be directly connected to the MRI device 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be part of the terminal 140. In some embodiments, the processing device 120 may be part of the MRI device 110.

The storage device 130 may store data, instructions, and/or any other information. In some embodiments, the storage device 130 may store data obtained from the MRI device 110, the processing device 120, and/or the terminal(s) 140. The data may include image data acquired by the processing device 120, algorithms and/or models for processing the image data, etc. For example, the storage device 130 may store a plurality of T1 weighted images determined by the processing device 120. In some embodiments, the storage device 130 may store data and/or instructions that the processing device 120 and/or the terminal 140 may execute or use to perform exemplary methods described in the present disclosure. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the MRI system 100 (e.g., the processing device 120, the terminal(s) 140). One or more components in the MRI system 100 may access the data or instructions stored in the storage device 130 via the network 150. In some embodiments, the storage device 130 may be integrated into the MRI device 110 or the processing device 120.

The terminal(s) 140 may be connected to and/or communicate with the MRI device 110, the processing device 120, and/or the storage device 130. In some embodiments, the terminal 140 may include a mobile device 141, a tablet computer 142, a laptop computer 143, or the like, or any combination thereof. For example, the mobile device 141 may include a mobile phone, a personal digital assistant (PDA), a gaming device, a navigation device, a point of sale (POS) device, a laptop, a tablet computer, a desktop, or the like, or any combination thereof. In some embodiments, the terminal 140 may include an input device, an output device, etc. The input device may include alphanumeric and other keys that may be input via a keyboard, a touchscreen (for example, with haptics or tactile feedback), a speech input, an eye tracking input, a brain monitoring system, or any other comparable input mechanism. Other types of the input device may include a cursor control device, such as a mouse, a trackball, or cursor direction keys, etc. The output device may include a display, a printer, or the like, or any combination thereof.

The network 150 may include any suitable network that can facilitate the exchange of information and/or data for the MRI system 100. In some embodiments, one or more components of the MRI system 100 (e.g., the MRI device 110, the processing device 120, the storage device 130, the terminal(s) 140, etc.) may communicate information and/or data with one or more other components of the MRI system 100 via the network 150. For example, the processing device 120 may obtain a plurality of first magnetic resonance (MR) data sets related to a region of interest (ROI) of a subject from the MRI device 110 or the storage device 130 via the network 150. As another example, the processing device 120 and/or the terminal 140 may obtain information stored in the storage device 130 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network (VPN), a satellite network, a telephone network, routers, hubs, witches, server computers, and/or any combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. However, those variations and modifications do not depart the scope of the present disclosure. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI device 110. As another example, a component of the MRI system 100 may be replaced by another component that can implement the functions of the component. As still another example, the processing device 120 and the terminal 140 may be integrated into a single device.

Figure 2:
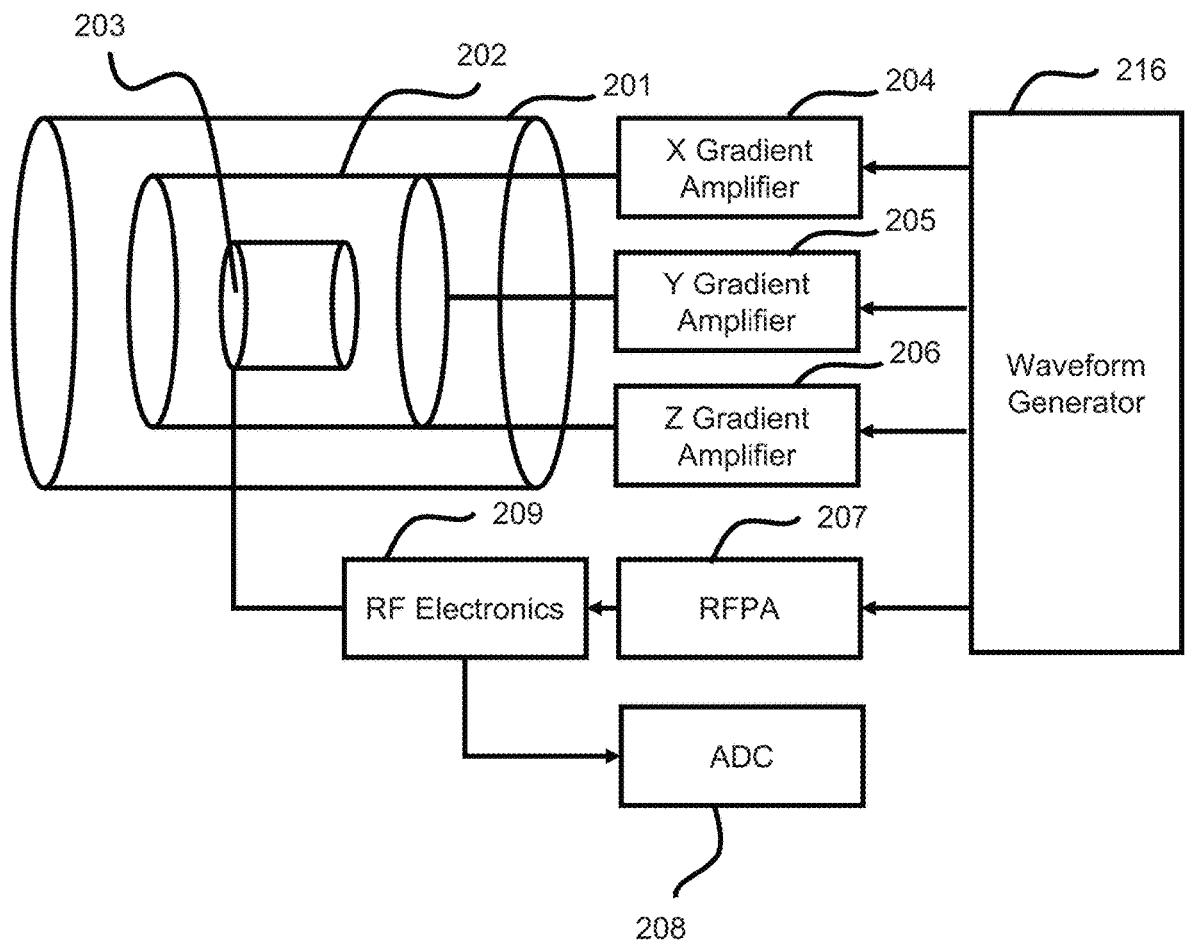
FIG. 2 is a schematic diagram illustrating an exemplary MRI device according to some embodiments of the present disclosure.

FIG. 2 is a schematic diagram illustrating an exemplary MRI device 110 according to some embodiments of the present disclosure. As illustrated, a main magnet 201 may generate a first magnetic field (or referred to as a main magnetic field) that may be applied to an object (also referred to as a subject) positioned inside the first magnetic field. The main magnet 201 may include a resistive magnet or a superconductive magnet that both need a power supply (not shown in FIG. 2) for operation. Alternatively, the main magnet 201 may include a permanent magnet. The main magnet 201 may form a detection region and surround, along the Z direction, the object that is moved into or positioned within the detection region. The main magnet 201 may also control the homogeneity of the generated main magnetic field. Some shim coils may be in the main magnet 201. The shim coils placed in the gap of the main magnet 201 may compensate for the inhomogeneity of the magnetic field of the main magnet 201. The shim coils may be energized by a shim power supply.

Gradient coils 202 may be located inside the main magnet 201. For example, the gradient coils 202 may be located in the detection region. The gradient coils 202 may surround, along the Z direction, the object that is moved into or positioned within the detection region. The gradient coils 202 may be surrounded by the main magnet 201 around the Z direction, and be closer to the object than the main magnet 201. The gradient coils 202 may generate a second magnetic field (or referred to as a gradient field, including gradient fields Gx, Gy, and Gz). The second magnetic field may be superimposed on the main magnetic field generated by the main magnet 201 and distort the main magnetic field so that the magnetic orientations of the protons of an object may vary as a function of their positions inside the gradient field, thereby encoding spatial information into MR signals generated by the region of the object being imaged. The gradient coils 202 may include X coils (e.g., configured to generate the gradient field Gx corresponding to the X direction), Y coils (e.g., configured to generate the gradient field Gy corresponding to the Y direction), and/or Z coils (e.g., configured to generate the gradient field Gz corresponding to the Z direction) (not shown in FIG. 2). In some embodiments, the Z coils may be designed based on circular (Maxwell) coils, while the X coils and the Y coils may be designed on the basis of the saddle (Golay) coil configuration. The three sets of coils may generate three different magnetic fields that are used for position encoding. The gradient coils 202 may allow spatial encoding of MR signals for image reconstruction. The gradient coils 202 may be connected with one or more of an X gradient amplifier 204, a Y gradient amplifier 205, or a Z gradient amplifier 206. One or more of the three amplifiers may be connected to a waveform generator 216. The waveform generator 216 may generate gradient waveforms that are applied to the X gradient amplifier 204, the Y gradient amplifier 205, and/or the Z gradient amplifier 206. An amplifier may amplify a waveform. An amplified waveform may be applied to one of the coils in the gradient coils 202 to generate a magnetic field in the X-axis, the Y-axis, or the Z-axis, respectively. The gradient coils 202 may be designed for either a close-bore MRI scanner or an open-bore MRI scanner. In some instances, all three sets of coils of the gradient coils 202 may be energized and three gradient fields may be generated thereby. In some embodiments of the present disclosure, the X coils and Y coils may be energized to generate the gradient fields in the X direction and the Y direction. As used herein, the X-axis, the Y-axis, the Z-axis, the X direction, the Y direction, and the Z direction in the description of FIG. 2 are the same as or similar to those described in FIG. 1.

In some embodiments, radio frequency (RF) coils 203 may be located inside the main magnet 201 and serve as transmitters, receivers, or both. For example, the RF coils 203 may be located in the detection region. The RF coils 203 may surround, along the Z direction, the object that is moved into or positioned within the detection region. The RF coils 203 may be surrounded by the main magnet 201 and/or the gradient coils 202 around the Z direction, and be closer to the object than the gradient coils 202. The RF coils 203 may be in connection with RF electronics 209 that may be configured or used as one or more integrated circuits (ICs) functioning as a waveform transmitter and/or a waveform receiver. The RF electronics 209 may be connected to a radiofrequency power amplifier (RFPA) 207 and an analog-to-digital converter (ADC) 208.

When used as transmitters, the RF coils 203 may generate RF signals that provide a third magnetic field that is utilized to generate MR signals related to the region of the object being imaged. The third magnetic field may be perpendicular to the main magnetic field. The waveform generator 216 may generate an RF pulse. The RF pulse may be amplified by the RFPA 207, processed by the RF electronics 209, and applied to the RF coils 203 to generate the RF signals in response to a powerful current generated by the RF electronics 209 based on the amplified RF pulse.

When used as receivers, the RF coils may be responsible for detecting MR signals (e.g., echoes). After excitation, the MR signals generated by the object may be sensed by the RF coils 203. The receive amplifier then may receive the sensed MR signals from the RF coils 203, amplify the sensed MR signals, and provide the amplified MR signals to the ADC 208. The ADC 208 may transform the MR signals from analog signals to digital signals. The digital MR signals then may be sent to the processing device 140 for sampling.

In some embodiments, the main magnet coil 201, the gradient coils 202, and the RF coils 203 may be circumferentially positioned with respect to the object around the Z direction. It is understood by those skilled in the art that the main magnet 201, the gradient coils 202, and the RF coils 203 may be situated in a variety of configurations around the object.

In some embodiments, the RFPA 207 may amplify an RF pulse (e.g., the power of the RF pulse, the voltage of the RF pulse) such that an amplified RF pulse is generated to drive the RF coils 203. The RFPA 207 may include a transistor-based RFPA, a vacuum tube-based RFPA, or the like, or any combination thereof. The transistor-based RFPA may include one or more transistors. The vacuum tube-based RFPA may include a triode, a tetrode, a klystron, or the like, or any combination thereof. In some embodiments, the RFPA 207 may include a linear RFPA, or a nonlinear RFPA. In some embodiments, the RFPA 207 may include one or more RFPAs.

In some embodiments, the MRI device 110 may further include a subject positioning system (not shown). The subject positioning system may include a subject cradle and a transport device. The subject may be placed on the subject cradle and be positioned by the transport device within the bore of the main magnet 201.

MRI systems (e.g., the MRI system 100 disclosed in the present disclosure) may be commonly used to obtain an interior image from a patient for a particular region of interest (ROI) that can be used for the purposes of, e.g., diagnosis, treatment, or the like, or a combination thereof. MRI systems include a main magnet (e.g., the main magnet 201) assembly for providing a main magnetic field to align the individual magnetic moments of the protons within the patient's body. During this process, the protons precess around their magnetic poles at their characteristic Larmor frequency. This state may be referred to as an equilibrium state. If the tissue is subjected to an additional magnetic field, which is tuned to the Larmor frequency, the protons absorb additional energy, which rotates the net aligned moment of the protons. This state may be referred to as an excitation state. The additional magnetic field may be provided by an RF excitation signal (e.g., the RF signal generated by the RF coils 203). When the additional magnetic field is removed, the magnetic moments of the protons rotate back into alignment with the main magnetic field thereby emitting an echo signal. The echo signal is received and processed to form an MRI image. T1 relaxation may be the process by which the net magnetization grows/returns to its initial maximum value parallel to the main magnetic field. T1 may be the time constant for regrowth of longitudinal magnetization (e.g., along the main magnetic field). T2 relaxation may be the process by which the transverse components of magnetization decay or dephase. T2 may be the time constant for decay/dephasing of transverse magnetization.

But in fact, the main magnetic field cannot achieve absolute uniformity. The rotation frequency of hydrogen atoms is related to the strength of the main magnetic field. The inhomogeneous main magnetic field may cause hydrogen atoms in different positions to rotate at different frequencies. Hydrogen atoms that locate in places with lower magnetic field strength may rotate more slowly. Hydrogen atoms that locate in places with higher magnetic field strength may rotate faster. Therefore, the rotation of hydrogen atoms may be out of sync, and the direction of their magnetization vectors may be more dispersed. The sum of these vectors may have a small amplitude, which accelerates the transverse magnetization decay. The time constant of the accelerated decay is T2*, which is smaller than T2.

If the main magnetic field is uniform across the entire body of the patient, then the RF excitation signal may excite all of the protons in the sample non-selectively. Accordingly, in order to image a particular portion of the patient's body, magnetic field gradients Gx, Gy, and Gz (e.g., generated by the gradient coils 202) in the X, Y, and Z directions, having a particular timing, frequency, and phase, may be superimposed on the uniform magnetic field such that the RF excitation signal excites the protons in a desired slice of the patient's body, and unique phase and frequency information is encoded in the echo signal depending on the location of the protons in the "image slice." Based on a gradient encoding, a Fourier imaging may be performed, in which measurements representing the spatial frequency of the subject, termed as k-space, can be acquired using a specific sampling trajectory. The specific sampling trajectory may include a Cartesian trajectory or a non-Cartesian trajectory such as a spiral trajectory, a radial trajectory, etc., and an image reconstruction is performed by applying an inverse Fourier transform (e.g., inverse fast Fourier transform) on k-space data.

Typically, portions of the patient's body to be imaged are scanned by a sequence of measurement cycles in which the RF excitation signals and the magnetic field gradients Gx, Gy and Gz vary according to an MRI imaging protocol that is being used. A protocol may be designed for one or more tissues to be imaged, diseases, and/or clinical scenarios. A protocol may include a certain number of pulse sequences oriented in different planes and/or with different parameters. The pulse sequences may include spin echo sequences, gradient echo sequences, diffusion sequences, inversion recovery sequences, or the like, or any combination thereof. For instance, the spin echo sequences may include a fast spin echo (FSE) pulse sequence, a turbo spin echo (TSE) pulse sequence, a rapid acquisition with relaxation enhancement (RARE) pulse sequence, a half-Fourier acquisition single-shot turbo spin-echo (HASTE) pulse sequence, a turbo gradient spin echo (TGSE) pulse sequence, or the like, or any combination thereof. As another example, the gradient echo sequences may include a balanced steady-state free precession (bSSFP) pulse sequence, a spoiled gradient echo (GRE) pulse sequence, and an echo planar imaging (EPI) pulse sequence, a steady state free precession (SSFP), or the like, or any combination thereof. For each MRI scan, the resulting echo signals may be digitized and processed to reconstruct an image in accordance with the MRI imaging protocol that is used.

Figure 3:
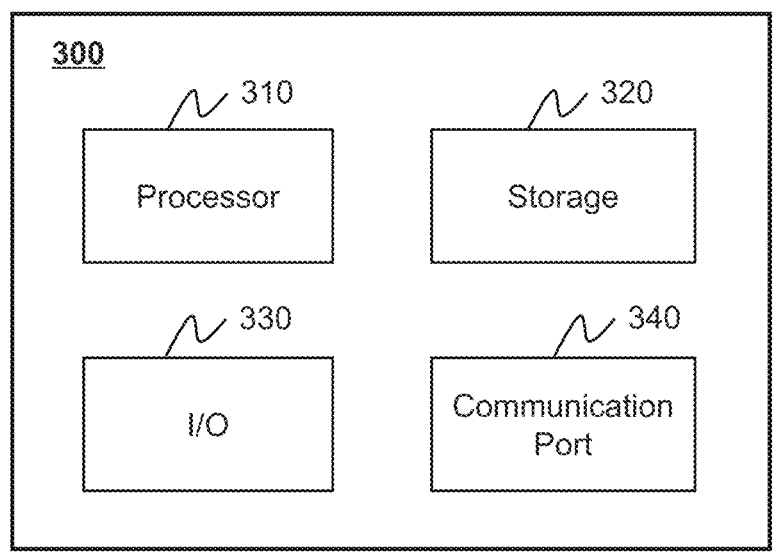
FIG. 3 is a schematic diagram illustrating exemplary hardware and/or software components of a computing device according to some embodiments of the present disclosure.

FIG. 3 is a schematic diagram illustrating exemplary hardware and/or software components of a computing device 300 according to some embodiments of the present disclosure. In some embodiments, one or more components of the MRI system 100 may be implemented on one or more components of the computing device 300. Merely by way of example, the processing device 120 may be implemented one or more components of the computing device 300.

As illustrated in FIG. 3, the computing device 300 may include a processor 310, a storage device 320, an input/output (I/O) 330, and a communication port 340. The processor 310 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 310 may process image data of a subject obtained from the MRI device 110, the storage device 130, terminal(s) 140, and/or any other component of the MRI system 100.

In some embodiments, the processor 310 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or a combinations thereof.

Merely for illustration, only one processor is described in the computing device 300. However, it should be noted that the computing device 300 in the present disclosure may also include multiple processors. Thus operations and/or method steps that are performed by one processor as described in the present disclosure may also be jointly or separately performed by the multiple processors. For example, if in the present disclosure the processor of the computing device 300 executes both operation A and operation B, it should be understood that operation A and operation B may also be performed by two or more different processors jointly or separately in the computing device 300 (e.g., a first processor executes operation A and a second processor executes operation B, or the first and second processors jointly execute operations A and B).

The storage device 320 may store data/information obtained from the MRI device 110, the storage device 130, the terminal(s) 140, and/or any other component of the MRI system 100. In some embodiments, the storage device 320 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random-access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 320 may store one or more programs and/or instructions to perform exemplary methods described in the present disclosure.

The I/O 330 may input and/or output signals, data, information, etc. In some embodiments, the I/O 330 may enable a user interaction with the computing device 300 (e.g., the processing device 120). In some embodiments, the I/O 330 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 340 may be connected to a network (e.g., the network 150) to facilitate data communications. The communication port 340 may establish connections between the computing device 300 (e.g., the processing device 120) and one or more components of the MRI system 100 (e.g., the MRI device 110, the storage device 130, and/or the terminal(s) 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, the communication port 340 may be and/or include a standardized communication port, such as RS232, RS485, etc. In some embodiments, the communication port 340 may be a specially designed communication port. For example, the communication port 340 may be designed in accordance with the digital imaging and communications in medicine (DICOM) protocol.

Figure 4:
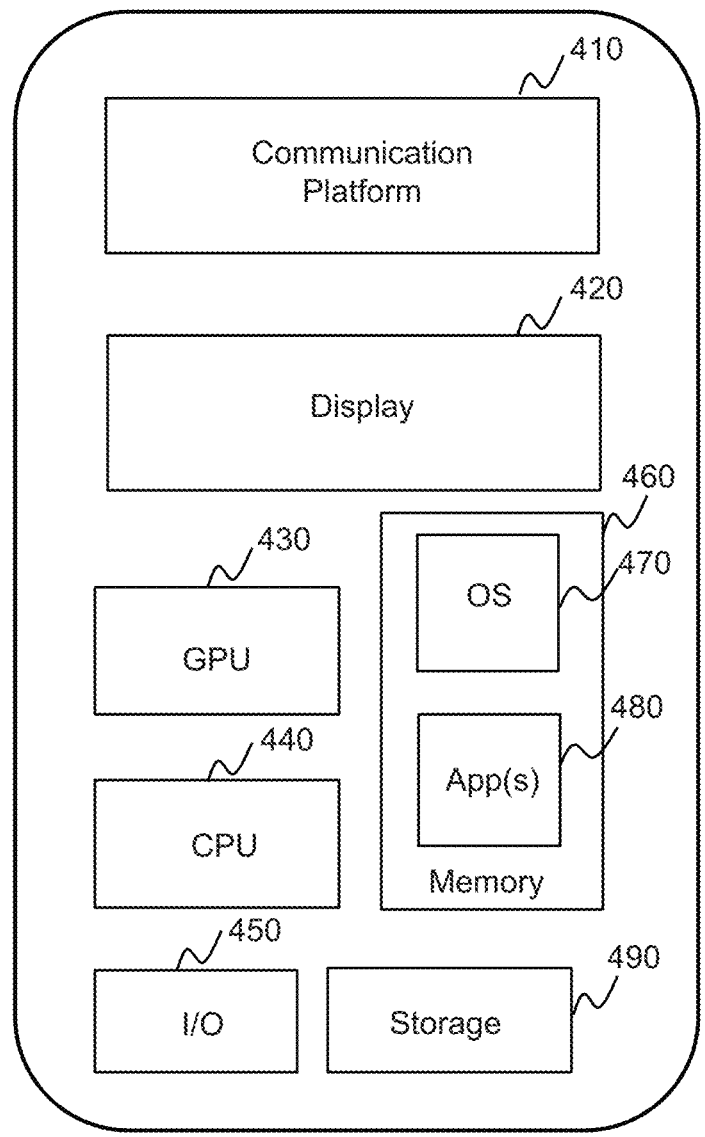
FIG. 4 is a schematic diagram illustrating exemplary hardware and/or software components of a mobile device may be implemented according to some embodiments of the present disclosure.

FIG. 4 is a schematic diagram illustrating exemplary hardware and/or software components of a mobile device 400 may be implemented according to some embodiments of the present disclosure. In some embodiments, one or more components of the MRI system 100 may be implemented on one or more components of the mobile device 400. Merely by way of example, the terminal 140 may be implemented on one or more components of the mobile device 400.

As illustrated in FIG. 4, the mobile device 400 may include a communication platform 410, a display 420, a graphics processing unit (GPU) 430, a central processing unit (CPU) 440, an I/O 450, a memory 460, and a storage 490. In some embodiments, any other suitable component, including but not limited to a system bus or a controller (not shown), may also be included in the mobile device 400. In some embodiments, a mobile operating system 470 (e.g., iOS™, Android™' Windows Phone™ etc.) and one or more applications 480 may be loaded into the memory 460 from the storage 490 in order to be executed by the CPU 440. The applications 480 may include a browser or any other suitable mobile apps for receiving and rendering information relating to the MRI system 100. User interactions with the information stream may be achieved via the I/O 450 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal. A computer may also act as a server if appropriately programmed.

Figure 5:
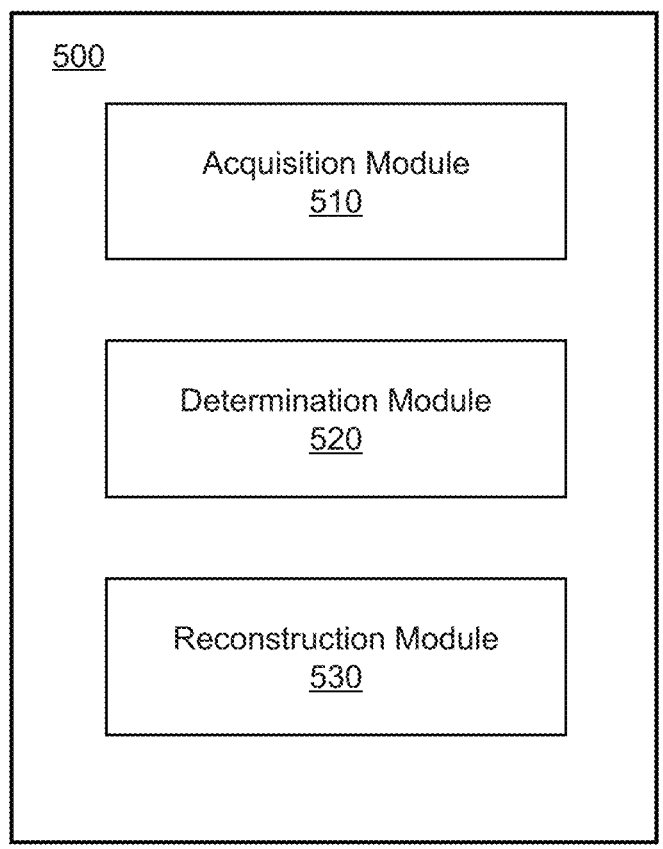
FIG. 5 is a schematic diagram illustrating an exemplary processing device according to some embodiments of the present disclosure.

FIG. 5 is a schematic diagram illustrating an exemplary processing device 500 according to some embodiments of the present disclosure. In some embodiments, the processing device 120 may include an acquisition module 510, a determination module 520, and a reconstruction module 530. In some embodiments, the processing device 500 may be hardware circuits of all or part of the processing device 120. The processing device 500 may also be implemented as an application or set of instructions read and executed by the processing device 120. Further, the processing device 500 may be any combination of the hardware circuits and the application/instructions. For example, the modules may be part of the processing device 120 when the processing device 120 is executing the application/set of instructions.

The acquisition module 510 may obtain a plurality of first magnetic resonance (MR) data sets related to a region of interest (ROI) of a subject. The plurality of first MR data sets may be collected based on two or more different values of a scan parameter. The scan parameter may include at least one of a flip angle or a repetition time (TR).

The determination module 520 may determine a plurality of second MR data sets based on the plurality of first MR data sets. Each of the plurality of second MR data sets may correspond to at least two of the plurality of first MR data sets.

The reconstruction module 530 may generate, based on the plurality of second MR data sets, a plurality of T1 weighted images of the ROI each of which corresponds to a target time point.

In some embodiments, the reconstruction module 530 may perform T1 mapping based on the plurality of first MR data sets.

In some embodiments, the reconstruction module 530 may estimate a contrast agent concentration corresponding to each target time point based on the plurality of T1 weighted images and the T1 mapping. The reconstruction module 530 may perform physiological analysis of the ROI based on the contrast agent concentration corresponding to each target time point.

In some embodiments, the reconstruction module 530 may determine a signal intensity corresponding to each target time point based on the plurality of T1 weighted images. The reconstruction module 530 may perform physiological analysis of the ROI based on the signal intensity corresponding to each target time point.

It should be noted that the above description of the processing device 120 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Two or more of the modules may be combined as a single module, and any one of the modules may be divided into two or more units.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may further include a storage module (not shown in FIG. 5). The storage module may be configured to store data generated during any process performed by any component of in the processing device 120. As another example, each of the components of the processing device 120 may include a storage device. Additionally or alternatively, the components of the processing device 120 may share a common storage device.

FIG. 6 is a flowchart illustrating an exemplary process 600 for generating a plurality of T1 weighted images according to some embodiments of the present disclosure. In some embodiments, the process 600 may be implemented in the MRI system 100 illustrated in FIG. 1. For example, the process 600 may be stored in the storage device 130 and/or the storage (e.g., the storage 320, the storage 490) as a form of instructions, and invoked and/or executed by the processing device 120 (e.g., the processor 310 of the computing device 300 as illustrated in FIG. 3, the CPU 440 of the mobile device 400 as illustrated in FIG. 4, or one or more modules illustrated in FIG. 5). The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting.

In 610, the processing device 120 (e.g., the acquisition module 510) may obtain a plurality of first magnetic resonance (MR) data sets related to a region of interest (ROI) of a subject. The plurality of first MR data sets may be collected based on two or more different values of a scan parameter. The scan parameter may include at least one of a flip angle or a repetition time (TR).

In some embodiments, each of the plurality of first MR data sets may be acquired by applying a pulse sequence to the ROI. The pulse sequence may include a radiofrequency (RF) excitation pulse that is played out in the presence of a slice selection gradient in order to produce transverse magnetization in the ROI. In some embodiments, the RF excitation pulse may have a flip angle. As used herein, the flip angle may be the rotation of the net magnetization vector by the RF excitation pulse relative to the main magnetic field. The TR may be between two consecutive RF excitation pulses.

In some embodiments, the pulse sequence may be a steady-state sequence. A main magnet (e.g., the main magnet 201) assembly may provide a main magnetic field to align the individual magnetic moments of the protons within the ROI. This state may be referred to as an equilibrium state. When the ROI is subjected to an additional magnetic field, which is tuned to the Larmor frequency, the protons absorb additional energy, which rotates the net aligned moment of the protons. This state may be referred to as an excitation state. The additional magnetic field may be provided by an RF excitation signal (e.g., the RF signal generated by the RF coils 203). The process from the excitation state back to the equilibrium state may be referred to as a T1 relaxation. The steady-state sequence may refer to a pulse sequence that can exert repeated RF excitation to the protons and create a steadily repeatable combination of equilibrium state, excitation state and relaxation state. The steady-state sequence may include a spin echo (SE) sequence, a gradient echo (GRE) sequence, a magnetization preparation rapid gradient echo (IR-GRE) sequence, a magnetization preparation fast spin echo sequence, a gradient- and spin-echo (GRASE) sequence, etc.

The plurality of first MR data sets may include k-space data acquired by filling one or more echoes of the ROI received by a plurality of receiving coils (e.g., the RF coils 203) of an MRI device (e.g., the MRI device 110) into k-space along a sampling pattern.

In some embodiments, the ROI may include a slab or a volume of the subject for 3D imaging. In some embodiments, the ROI may include one or more slices of the subject for 2D imaging.

In some embodiments, the plurality of first MR data sets may include two-dimensional (2D) k-space data, three-dimensional (3D) k-space data, four-dimensional (4D) k-space data, or the like. As used herein, 4D k-space data refers to a data form containing 2D or 3D k-space data over time. Merely by way of example, the 3D k-space data may be a 256*256*256 digital matrix. In some embodiments, the plurality of first MR data sets may be undersampled, fully sampled, or oversampled.

In some embodiments, each of the plurality of first MR data sets may be acquired by completing k-space sampling in a temporally continuous manner. In some embodiments, the plurality of first MR data sets may be acquired in a temporally separated manner.

In some embodiments, each of the plurality of first MR data sets may be collected based on one of the two or more values of the scan parameter. Each of the plurality of first MR data sets may be collected using a pulse sequence with a flip angle and a TR. In some embodiments, the plurality of first MR data sets may be collected based on two or more values of flip angle and a same value of TR. For example, each of the plurality of first MR data sets may be collected based on one of the two or more values of flip angle and the same value of TR. In some embodiments, the plurality of first MR data sets may be collected based on two or more values of TR and a same value of flip angle. For example, each of the plurality of first MR data sets may be collected based on one of the two or more values of TR and the same value of flip angle. In some embodiments, the plurality of first MR data sets may be collected based on two or more values of flip angle and two or more values of TR. For example, each of the plurality of first MR data sets may be collected based on one of the two or more values of flip angle and one of the two or more values of TR.

In some embodiments, the two or more values of flip angle may be of any value. For example, for a first pulse sequence applied on the ROI, the value of flip angle may be greater than an Ernst angle ($A_E = \arccos(e^{-TR/T1})$) corresponding to the TR of the first pulse sequence and T1 of the ROI. For a second pulse sequence applied on the ROI, the value of flip angle may be less than the Ernst angle corresponding to the TR of the second pulse sequence and T1 of the ROI. In some embodiments, the plurality of first MR data sets may be used for T1 weighted dynamic imaging, and the TR used to acquire the plurality of first MR data sets may be relatively short, e.g., shorter than 500 ms.

In some embodiments, the processing device 120 may obtain the plurality of first MR data sets from one or more components (e.g., the MRI device 110, the terminal 140, and/or the storage device 130) of the MRI system 100 or an external storage device via the network 150. For example, the MRI device 110 may transmit the plurality of first MR data sets to the storage device 130, or any other storage device for storage. The processing device 120 may obtain the plurality of first MR data sets from the storage device 130, or any other storage device. As another example, the processing device 120 may obtain the plurality of first MR data sets from the MRI device 110 directly.

In 620, the processing device 120 (e.g., the determination module 520) may determine a plurality of second MR data sets based on the plurality of first MR data sets. Each of the plurality of second MR data sets may correspond to at least two of the plurality of first MR data sets.

In some embodiments, the at least two of the plurality of first MR data sets corresponding to a second MR data set may correspond to two different values of the scan parameter. For example, the at least two of the plurality of first MR data sets corresponding to a second MR data set may correspond to two different values of flip angle. As another example, the at least two of the plurality of first MR data sets corresponding to a second MR data set may correspond to two different values of TR. As still another example, the at least two of the plurality of first MR data sets corresponding to a second MR data set may correspond to two different values of flip angle and two different values of TR.

In some embodiments, for one of the plurality of second MR data sets, the processing device 120 may obtain at least one first MR data set related to a first value of the scan parameter. The processing device 120 may obtain at least one first MR data set related to a second value of the scan parameter. The processing device 120 may perform division based on the at least two of the plurality of first MR data sets related to the first value and the second value of the scan parameter. For example, the processing device 120 may perform division between a first MR data set related to the first value and a first MR data set related to the second value of the scan parameter to determine the second MR data set. As another example, the processing device 120 may deter-mine a first average of at least two first MR data sets related to the first value of the scan parameter, and a second average of at least two first MR data sets related to the second value of the scan parameter. The processing device 120 may perform division between the first average and the second average to determine the second MR data set. As still another example, the processing device 120 may determine an average of at least two first MR data sets related to the first value of the scan parameter. The processing device 120 may perform division between the average and a first MR data set related to the second value of the scan parameter to determine the second MR data set. As yet another example, the processing device 120 may determine an average of at least two first MR data sets related to the second value of the scan parameter. The processing device 120 may perform division between the average and a first MR data set related to the first value of the scan parameter to determine the second MR data set.

In some embodiments, the plurality of first MR data sets may be collected so that any two adjacent first MR data sets correspond to different values of the scan parameter. For each of the plurality of second MR data sets, the processing device 120 may determine the second MR data set based on two adjacent first MR data sets. For example, the processing device 120 may determine a second MR data set based on a division of two adjacent first MR data sets.

For example, the plurality of first MR data sets may be collected based on two or more different values of the flip angle and a fixed value of the TR; two or more different values of the TR and a fixed value of the flip angle; or two or more different values of the flip angle and two or more different values of the TR. The plurality of first MR data sets may be collected so that any two adjacent first MR data sets correspond to different values of at least one of the flip angle or the TR. For each of the plurality of second MR data sets, the processing device 120 may determine the second MR data set by performing division between two adjacent first MR data sets.

The second MR data set may correspond to a time point (e.g., an average time point) within a time period in which the two adjacent first MR data sets are acquired. For example, for two adjacent first MR data sets A and B in time order, the first MR data set A may be acquired during a time period t1 of which the start point is t, and the first MR data set B may be acquired during a time period t2. The time point related to a second MR data set corresponding to the two adjacent first MR data sets A and B may be t+(t1+t2)/2.

In some embodiments, at least one of the plurality of first MR data sets corresponding to a first value of the two or more value of the scan parameter may be collected before the rest of the plurality of first MR data sets corresponding to the rest of the two or more values of the scan parameter.

In some embodiments, the processing device 120 may determine an average of the at least one of the plurality of first MR data sets corresponding to the first value of the two or more value of the scan parameter. For each of the plurality of second MR data sets, the processing device 120 may determine the second MR data set based on the average and one of the rest of the plurality of first MR data sets. For example, the processing device 120 may determine a second MR data set based on a division of the average and one of the rest of the plurality of first MR data sets.

For example, the plurality of first MR data sets may be collected based on two or more different values of the flip angle and a fixed value of the TR; or two or more different values of the TR and a fixed value of the flip angle. At least one of the plurality of first MR data sets corresponding to a first value of the two or more values of the flip angle or the TR may be collected before the rest of the plurality of first MR data sets corresponding to the rest of the two or more values of the flip angle or the TR. As another example, the plurality of first MR data sets may be collected based on two or more different values of the flip angle and two or more different values of the TR. At least one of the plurality of first MR data sets corresponding to a first value of the two or more values of the flip angle and a first value of the two or more values of the TR may be collected before the rest of the plurality of first MR data sets corresponding to the rest of the two or more values of the flip angle and the rest of the two or more values of the TR. In the above two examples, the processing device 120 may determine an average of the at least one of the plurality of first MR data sets. For each of the plurality of second MR data sets, the processing device 120 may determine the second MR data set by performing division between the average and one of the rest of the plurality of first MR data sets.

In some embodiments, the second MR data set may correspond to a time point in a time period in which the one of the rest of the plurality of first MR data sets is acquired. For example, if the first MR data set is acquired based on Cartesian trajectory, the time point corresponding to the second MR data set may be the time when a phase encoding line (Ky=0) of the k-space center is sampled.

In some embodiments, the plurality of first MR data sets may be acquired based on an injection of a contrast agent into the ROI, e.g., the plurality of first MR data sets may be acquired based on dynamic contrast enhanced (DCE) imaging. In this case, at least one of the plurality of first MR data sets may be acquired before the injection of the contrast agent into the ROI, and the rest of the plurality of first MR data sets may be acquired after the injection of the contrast agent.

More Details regarding the determination of the plurality of second MR data sets may be found elsewhere in the present disclosure (e.g., the description in connection with FIGS. 7A-8C).

In 630, the processing device 120 (e.g., the reconstruction module 530) may generate, based on the plurality of second MR data sets, a plurality of T1 weighted images of the ROI each of which corresponds to a target time point. In some embodiments, a T1 weighted image of the ROI may include a 2D or 3D image. In some embodiments, each of the plurality of T1 weighted images may be generated by reconstructing one of the plurality of second MR data sets. The target time point of a T1 weighted image may be the time point corresponding to the second MR data set used to generate the T1 weighted image.

In some embodiments, the processing device 120 may generate, based on the plurality of second MR data sets, the plurality of T1 weighted images using any reconstruction algorithm, such as parallel imaging (PI), multi-band (MB) imaging, compress sensing (CS), artificial intelligence (AI) reconstruction, or the like, or any combination thereof.

In some embodiments, the processing device 120 may determine a signal intensity corresponding to each target time point based on the plurality of T1 weighted images. In some embodiments, the pixel values (e.g., gray values) may be related to (for example, linear relation) the signal intensity, and the signal intensity corresponding to each T1 weighted image may be determined based on the pixel values of the T1 weighted image. For example, the processing device 120 may determine an average of pixel values of all pixels in a T1 weighted image, and specify the average as the signal intensity (e.g., an average signal intensity) of the T1 weighted image. For another example, the processing device 120 may identify one or more regions in a T1 weighted image. The processing device 120 may determine an average of pixel values of the pixels in the one or more regions, and specify the average as the signal intensity (e.g., an average signal intensity) of the T1 weighted image. Then, according to the signal intensity and target time point corresponding to each T1 weighted image, the processing device 120 may generate an intensity-time curve.

Figure 9:
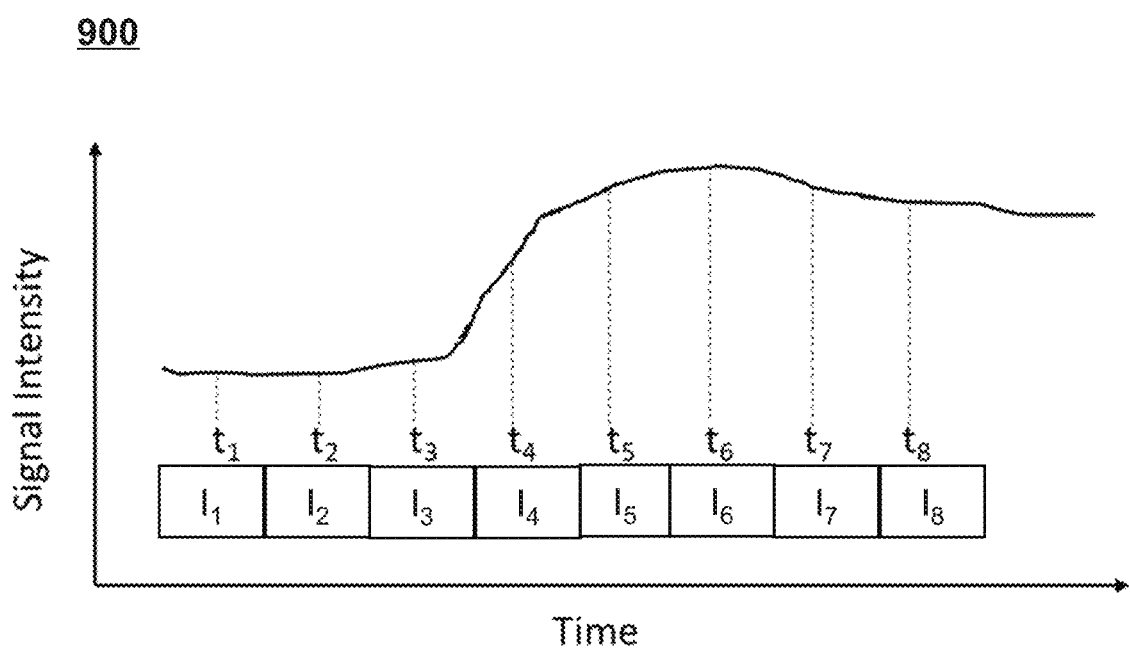
FIG. 9 is a schematic diagram illustrating an exemplary intensity-time curve according to some embodiments of the present disclosure.

FIG. 9 is a schematic diagram illustrating an exemplary intensity-time curve 900 according to some embodiments of the present disclosure.

As shown in FIG. 9, the processing device 120 may generate, based on the process 600, a plurality of T1 weighted images $I_1$-$I_8$ corresponding to target time points $t_1$-$t_8$, respectively. The processing device 120 may determine a signal intensity corresponding to each target time point based on the plurality of T1 weighted images, and determine the intensity-time curve 900 based on the signal intensities corresponding to the target time points $t_1$-$t_8$.

In some embodiments, the processing device 120 may perform physiological analysis based on the signal intensity corresponding to each target time point. For example, the processing device 120 may perform physiological analysis based on the intensity-time curve.

To perform physiological analysis, imaging of contrast agent uptake within the ROI may be performed. In some embodiments, dynamic contrast enhanced imaging may be applied for physiological analysis.

DCE imaging is an imaging technique that uses characteristics of tissue blood vessels. DCE imaging can provide information about the characteristics of physiological tissues. In DCE imaging, a contrast agent is usually injected into the patient's body, and T1 weighted magnetic resonance images before and after the injection of the contrast agent are collected. Due to the permeability of the capillaries, the surface area of the blood vessels and the blood flow velocity are different, the diffusion speed of the contrast agent is different. There are differences between different organizations, thus forming a contrast in the images. Methods used for DCE data analysis mainly include semi-quantitative and quantitative. Semi-quantitative analysis is based on intensity-time curve analysis to obtain characteristics such as tissue perfusion, capillary surface area, capillary permeability, and extravascular-extracellular space (EES). Exemplary semi-quantitative analysis parameters may include onset time, time to peak, maximum signal intensity, etc., which describe the shape and the composition of the intensity-time curve. Quantitative analysis may determine the contrast agent concentration in the ROI, and then analyze the characteristics of tissue perfusion, capillary surface area, capillary permeability, and extravascular-extracellular space (EES). Simple quantitative parameters may include the initial area under the curve. Quantitative analysis can also fit multiple pharmacokinetic models to mathematically analyze and determine the intensity-time curve.

Figure 7A:
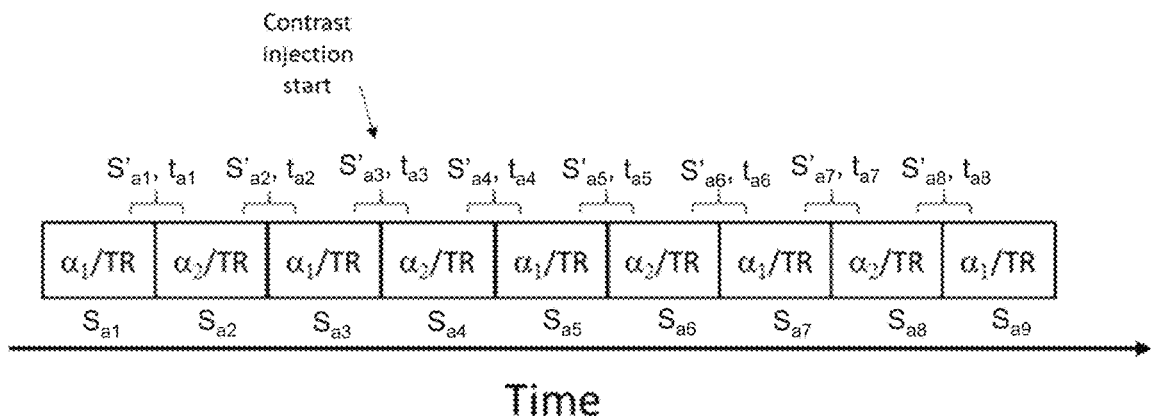
FIGS. 7A-7C are schematic diagrams illustrating exemplary acquisition of a plurality of first MR data sets according to some embodiments of the present disclosure.
Figure 7B:
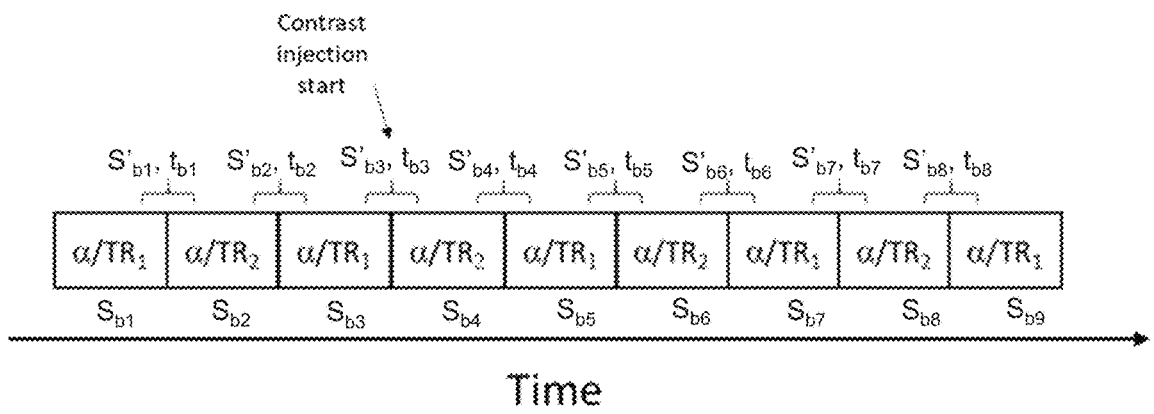
Figure 7C:
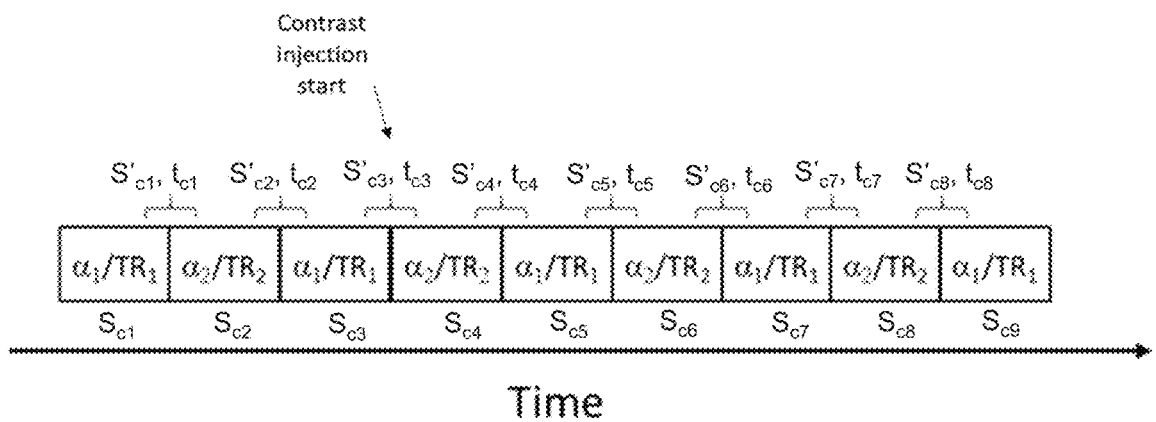
Figure 8A:
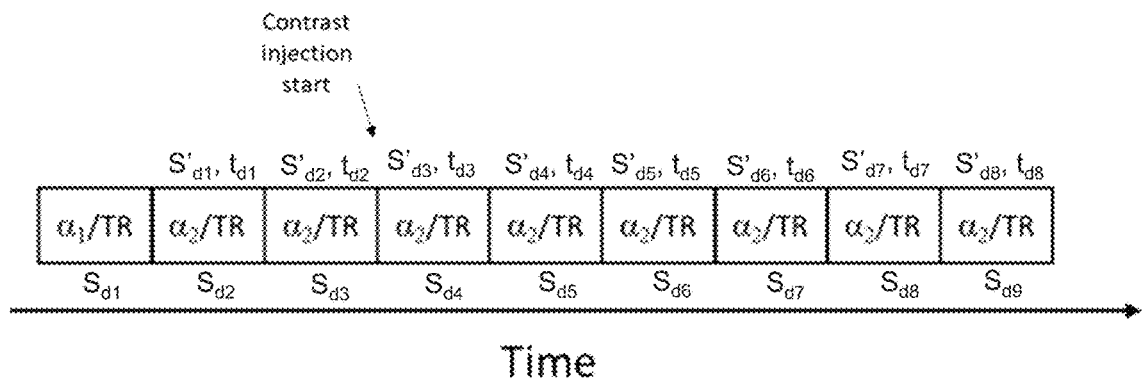
FIGS. 8A-8C are schematic diagrams illustrating exemplary acquisition of a plurality of first MR data sets according to some embodiments of the present disclosure.
Figure 8B:
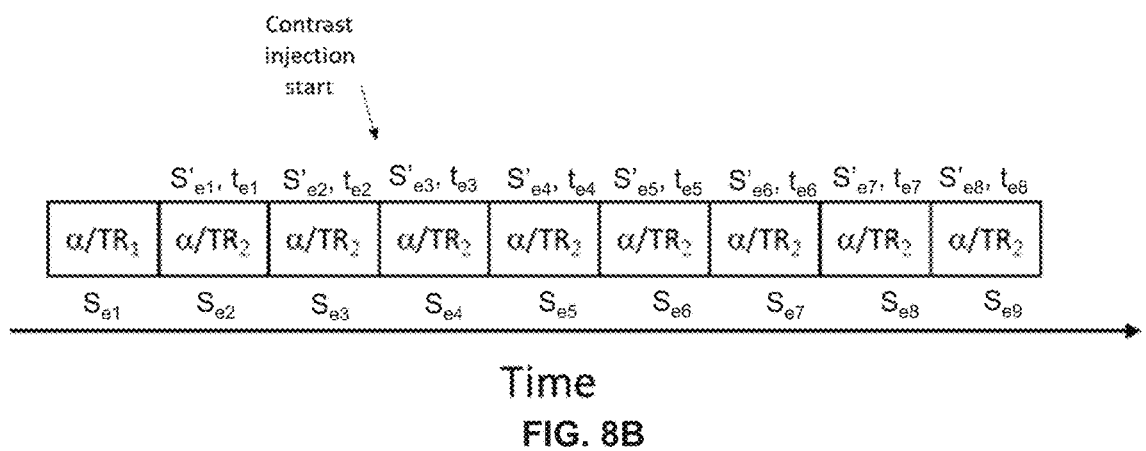
Figure 8C:
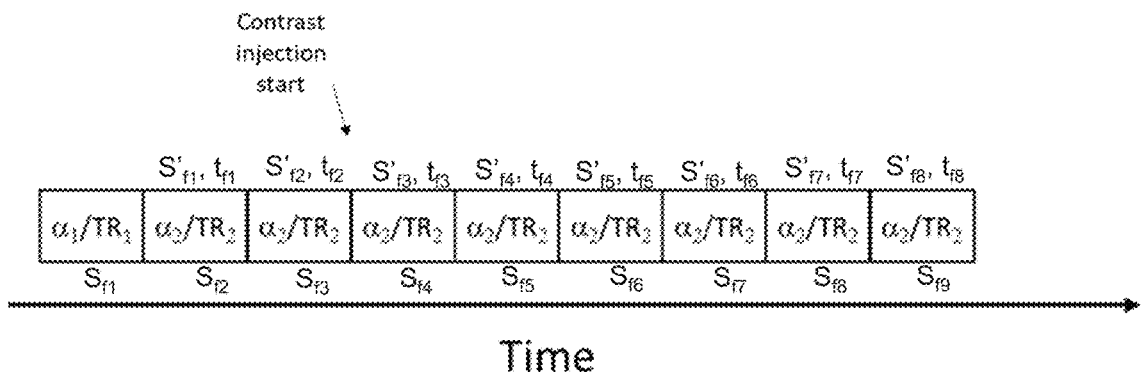

In some embodiments, the processing device 120 may perform T1 mapping based on the plurality of first MR data sets. In some embodiments, if the plurality of first MR data sets are collected based on two or more values of flip angle (as shown in FIG. 7A and FIG. 8A) or two or more values of TR (as shown in FIG. 7B and FIG. 8B), the processing device 120 may perform T1 mapping based on the plurality of first MR data sets; if the plurality of first MR data sets are collected based on two or more values of flip angle and two or more values of TR (as shown in FIG. 7C and FIG. 8C), T1 mapping cannot be achieved based on the plurality of first MR data sets.

In some embodiments, the processing device 120 may perform T1 mapping using any suitable algorithm. For example, the processing device 120 may perform T1 mapping based on Equation (1) below:

$$\frac{S(\alpha, TR)}{\sin(\alpha)} = \frac{S(\alpha, TR)}{\tan(\alpha)}E + \rho(1-E), \tag{1}$$

wherein ρ refers to a coefficient related to longitudinal magnetization; S(α,TR) refers to a first MR data set acquired based on a flip angle α and a TR; and $E=e^{-TR/T1}$.

Equation (1) may be regarded as a linear equation between $$\frac{S(\alpha, TR)}{\sin(\alpha)}$$

and $$\frac{S(\alpha, TR)}{\tan(\alpha)}. \tag{1}$$

The processing device 120 may determine the slope E and the intercept ρ(1−E) based on at least two of the plurality of first MR data sets, thereby determining a T1 value for each pixel or voxel and achieving T1 mapping, e.g., generating a quantitative T1 map.

In some embodiments, the processing device 120 may estimate a contrast agent concentration corresponding to each target time point based on the plurality of T1 weighted images and the T1 mapping. The processing device 120 may estimate the contrast agent concentration corresponding to each target time point based on the plurality of T1 weighted images and the T1 mapping using any suitable algorithm.

The processing device 120 may perform physiological analysis (e.g., DCE analysis) based on the contrast agent concentration corresponding to each target time point. For example, the processing device 120 may determine a concentration-time curve based on the contrast agent concentration corresponding to the target time points, and perform physiological analysis (e.g., DCE analysis) based on the concentration-time curve.

It should be noted that the above description regarding the process 600 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the process 600 may be accomplished with one or more additional operations not described and/or without one or more of the operations discussed above. In some embodiments, the Equations provided above are illustrative examples and can be modified in various ways. For example, one or more coefficients in an Equation may be omitted, and/or the Equation may further include one or more additional coefficients.

FIGS. 7A-7C are schematic diagrams illustrating exemplary acquisition of a plurality of first MR data sets according to some embodiments of the present disclosure.

As shown in FIG. 7A, the processing device 120 may obtain a plurality of first MR data sets $S_{a1}$-$S_{a9}$. $S_{a1}$-$S_{a9}$ may be acquired in chronological order. $S_{a1}$-$S_{a9}$ may be acquired based on two different flip angles ($\alpha_1$ and $\alpha_2$) and the same TR. Each of $S_{a1}$-$S_{a9}$ may correspond to the same TR and one of $\alpha_1$ and $\alpha_2$. $S_{a1}$-$S_{a9}$ may be collected so that any two adjacent first MR data sets correspond to different values of flip angle. For example, as shown in FIG. 7A, $\alpha_1$ and $\alpha_2$ may be applied alternately to acquire $S_{a1}$-$S_{a9}$.

The processing device 120 may determine a second MR data set based on two adjacent first MR data sets. As shown in FIG. 7A, the processing device 120 may determine a division of $S_{a1}$ and $S_{a2}$ to determine a second MR data set $S'_{a1}$. $S'_{a1}$ may correspond to a time point tai (e.g., an average time point) within a time period in which $S_{a1}$ and $S_{a2}$ are acquired. The processing device 120 may determine a division of $S_{a2}$ and $S_{a3}$ to determine a second MR data set $S'_{a2}$. $S'_{a2}$ may correspond to a time point $t_{a2}$ (e.g., an average time point) within a time period in which $S_{a2}$ and $S_{a3}$ are acquired. The processing device 120 may determine a division of $S_{a3}$ and $S_{a4}$ to determine a second MR data set $S'_{a3}$. $S'_{a3}$ may correspond to a time point $t_{a3}$ (e.g., an average time point) within a time period in which $S_{a3}$ and $S_{a4}$ are acquired. The processing device 120 may determine a division of $S_{a4}$ and $S_{a5}$ to determine a second MR data set $S'_{a4}$. $S'_{a4}$ may correspond to a time point $t_{a4}$ (e.g., an average time point) within a time period in which $S_{a4}$ and $S_{a5}$ are acquired. The processing device 120 may determine a division of $S_{a5}$ and $S_{a6}$ to determine a second MR data set $S'_{a5}$. $S'_{a5}$ may correspond to a time point $t_{a5}$ (e.g., an average time point) within a time period in which $S_{a5}$ and $S_{a6}$ are acquired. The processing device 120 may determine a division of $S_{a6}$ and $S_{a7}$ to determine a second MR data set $S'_{a6}$. $S'_{a6}$ may correspond to a time point $t_{a6}$ (e.g., an average time point) within a time period in which $S_{a6}$ and $S_{a7}$ are acquired. The processing device 120 may determine a division of $S_{a7}$ and $S_{a8}$ to determine a second MR data set $S'_{a7}$. $S'_{a7}$ may correspond to a time point $t_{a7}$ (e.g., an average time point) within a time period in which $S_{a7}$ and $S_{a8}$ are acquired. The processing device 120 may determine a division of $S_{a8}$ and $S_{a9}$ to determine a second MR data set $S'_{a8}$. $S'_{a8}$ may correspond to a time point tab (e.g., an average time point) within a time period in which $S_{a8}$ and $S_{a9}$ are acquired.

In some embodiments, a first MR data set acquired based on a flip angle α and a TR may be represented based on Equation (2) below:

$$S(\alpha, TR) = M_0 \frac{(1-E)\sin(\alpha)}{1 - E\cos(\alpha)}, \tag{2}$$

wherein S(α, TR) refers to a first MR data set acquired based on a flip angle α and a TR; $E=e^{-TR/T1}$, and $M_0$ is the base signal that includes one or more non-T1 factors (e.g., related to equilibrium magnetization) of the ROI. The one or more non-T1 factors may depend on the configuration of the MRI device 110 and tissue properties of the ROI. For example, the one or more non-T1 factors may include T2*, a receiving coil sensitivity, an echo time (TE), a proton density of the ROI, or the like, or any combination thereof. Merely by way of example, $M_0=C\emptyset e^{-TE/T2*}$, wherein C refers to the receiving coil sensitivity, and Ø refers to the proton density.

Taking the second MR data set $S'_{a1}$ as an example, the processing device 120 may determine $S'_{a1}$ based on Equation (3) below:

$$S'_{a1} = \frac{S_{a2}(\alpha_2, TR)}{S_{a1}(\alpha_1, TR)} = \frac{\sin(\alpha_2)}{\sin(\alpha_1)} \cdot \frac{1 - E\cos(\alpha_1)}{1 - E\cos(\alpha_2)}. \quad (3)$$

In some embodiments, to determine the second MR data set $S'_{a1}$, there is no limit of the order of the division of the adjacent first MR data sets $S_{a1}$ and $S_{a2}$. The processing device 120 may also determine $S'_{a1}$ based on Equation (4) below:

$$S'_{a1} = \frac{S_{a1}(\alpha_1, TR)}{S_{a2}(\alpha_2, TR)} = \frac{\sin(\alpha_1)}{\sin(\alpha_2)} \cdot \frac{1 - E\cos(\alpha_2)}{1 - E\cos(\alpha_1)}. \quad (4)$$

$S'_{a2}$-$S'_{a8}$ may be determined based on an approach similar to Equation (3) or Equation (4).

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

As shown in FIG. 7B, the processing device 120 may obtain a plurality of first MR data sets $S_{b1}$-$S_{b9}$. $S_{b1}$-$S_{b9}$ may be acquired in chronological order. $S_{b1}$-$S_{b9}$ may be acquired based on two different values of TR ($TR_1$ and $TR_2$) and the same flip angle $\alpha$. Each of $S_{b1}$-$S_{b9}$ may correspond to the same flip angle $\alpha$ and one of $TR_1$ and $TR_2$. $S_{b1}$-$S_{b9}$ may be collected so that any two adjacent first MR data sets correspond to different values of TR. For example, as shown in FIG. 7B, $TR_1$ and $TR_2$ may be applied alternately to acquire $S_{b1}$-$S_{b9}$.

The processing device 120 may determine a second MR data set based on two adjacent first MR data sets. As shown in FIG. 7B, the processing device 120 may determine a division of $S_{b1}$ and $S_{b2}$ to determine a second MR data set $S'_{b1}$. $S'_{b1}$ may correspond to a time point $t_{b1}$ (e.g., an average time point) within a time period in which $S_{b1}$ and $S_{b2}$ are acquired. The processing device 120 may determine a division of $S_{b2}$ and $S_{b3}$ to determine a second MR data set $S'_{b2}$. $S'_{b2}$ may correspond to a time point $t_{b2}$ (e.g., an average time point) within a time period in which $S_{b2}$ and $S_{b3}$ are acquired. The processing device 120 may determine a division of $S_{b3}$ and $S_{b4}$ to determine a second MR data set $S'_{b3}$. $S'_{b3}$ may correspond to a time point $t_{b3}$ (e.g., an average time point) within a time period in which $S_{b3}$ and $S_{b4}$ are acquired. The processing device 120 may determine a division of $S_{b4}$ and $S_{b5}$ to determine a second MR data set $S'_{b4}$. $S'_{b4}$ may correspond to a time point $t_{b4}$ (e.g., an average time point) within a time period in which $S_{b4}$ and $S_{b5}$ are acquired. The processing device 120 may determine a division of $S_{b5}$ and $S_{b6}$ to determine a second MR data set $S'_{b5}$. $S'_{b5}$ may correspond to a time point $t_{b5}$ (e.g., an average time point) within a time period in which $S_{b5}$ and $S_{b6}$ are acquired. The processing device 120 may determine a division of $S_{b6}$ and $S_{b7}$ to determine a second MR data set $S'_{b6}$. $S'_{b6}$ may correspond to a time point $t_{b6}$ (e.g., an average time point) within a time period in which $S_{b6}$ and $S_{b7}$ are acquired. The processing device 120 may determine a division of $S_{b7}$ and $S_{b8}$ to determine a second MR data set $S'_{b7}$. $S'_{b7}$ may correspond to a time point $t_{b7}$ (e.g., an average time point) within a time period in which $S_{b7}$ and $S_{b8}$ are acquired. The processing device 120 may determine a division of $S_{b8}$ and $S_{b9}$ to determine a second MR data set $S'_{b8}$. $S'_{b8}$ may correspond to a time point $t_{b8}$ (e.g., an average time point) within a time period in which $S_{b8}$ and $S_{b9}$ are acquired.

Taking the second MR data set $S'_{b1}$ as an example, the processing device 120 may determine $S'_{b1}$ based on Equation (5) below:

$$S'_{b1} = \frac{S_{b2}(\alpha, TR_2)}{S_{b1}(\alpha, TR_1)} = \frac{1 - E_2}{1 - E_1} \cdot \frac{1 - E_1\cos(\alpha)}{1 - E_2\cos(\alpha)}, \quad (5)$$

wherein $E_1 = e^{-TR_1/T1}$, $E_2 = e^{-TR_2/T1}$.

In some embodiments, to determine the second MR data set $S'_{b1}$, there is no limit of the order of the division of the adjacent first MR data sets $S_{b1}$ and $S_{b2}$. The processing device 120 may also determine $S'_{b1}$ based on Equation (6) below:

$$S'_{b1} = \frac{S_{b1}(\alpha, TR_1)}{S_{b2}(\alpha, TR_2)} = \frac{1 - E_1}{1 - E_2} \cdot \frac{1 - E_2\cos(\alpha)}{1 - E_1\cos(\alpha)}. \quad (6)$$

$S'_{b2}$-$S'_{b8}$ may be determined based on an approach similar to Equation (5) or Equation (6).

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

As shown in FIG. 7C, the processing device 120 may obtain a plurality of first MR data sets $S_{c1}$-$S_{c9}$. $S_{c1}$-$S_{c9}$ may be acquired in chronological order. $S_{c1}$-$S_{c9}$ may be acquired based on two different values of TR ($TR_1$ and $TR_2$) and two different values of flip angle ($\alpha_1$ and $\alpha_2$). Each of $S_{c1}$-$S_{c9}$ may correspond to one of $\alpha_1$ and $\alpha_2$ and one of $TR_1$ and $TR_2$. $S_{c1}$-$S_{c9}$ may be collected so that any two adjacent first MR data sets correspond to different values of TR and different values of flip angle. For example, as shown in FIG. 7C, to acquire $S_{c1}$-$S_{c9}$, $TR_1$ and $TR_2$ may be applied alternately, and $\alpha_1$ and a 2 may be applied alternately. For example, as shown in FIG. 7C, $S_{c1}$ may correspond to $\alpha_1$ and $TR_1$, $S_{c2}$ may correspond to $\alpha_2$ and $TR_2$, and so on. As another example, Sic may correspond to $\alpha_1$ and $TR_2$, $S_{c2}$ may correspond to $\alpha_2$ and $TR_1$, and so on.

The processing device 120 may determine a second MR data set based on two adjacent first MR data sets. As shown in FIG. 7C, the processing device 120 may determine a division of $S_{c1}$ and $S_{c2}$ to determine a second MR data set $S'_{c1}$. $S'_{c1}$ may correspond to a time point $t_{c1}$ (e.g., an average time point) within a time period in which $S_{c1}$ and $S_{c2}$ are acquired. The processing device 120 may determine a division of $S_{c2}$ and $S_{c3}$ to determine a second MR data set $S'_{c2}$. $S'_{c2}$ may correspond to a time point $t_{c2}$ (e.g., an average time point) within a time period in which $S_{c2}$ and $S_{c3}$ are acquired. The processing device 120 may determine a division of $S_{c3}$ and $S_{c4}$ to determine a second MR data set $S'_{c3}$. $S'_{c3}$ may correspond to a time point $t_{c3}$ (e.g., an average time point) within a time period in which $S_{c3}$ and $S_{c4}$ are acquired. The processing device 120 may determine a division of $S_{c4}$ and $S_{c5}$ to determine a second MR data set $S'_{c4}$. $S'_{c4}$ may correspond to a time point $t_{c4}$ (e.g., an average time point)

within a time period in which $S_{c4}$ and $S_{c5}$ are acquired. The processing device 120 may determine a division of $S_{c5}$ and $S_{c6}$ to determine a second MR data set $S'_{c5}$. $S'_{c5}$ may correspond to a time point $t_{c5}$ (e.g., an average time point) within a time period in which $S_{c5}$ and $S_{c6}$ are acquired. The processing device 120 may determine a division of $S_{c6}$ and $S_{c7}$ to determine a second MR data set $S'_{c6}$. $S'_{c6}$ may correspond to a time point $t_{c6}$ (e.g., an average time point) within a time period in which $S_{c6}$ and $S_{c7}$ are acquired. The processing device 120 may determine a division of $S_{c7}$ and $S_{c8}$ to determine a second MR data set $S'_{c7}$. $S'_{c7}$ may correspond to a time point $t_{c7}$ (e.g., an average time point) within a time period in which $S_{c7}$ and $S_{c8}$ are acquired. The processing device 120 may determine a division of $S_{c8}$ and $S_{c9}$ to determine a second MR data set $S'_{c8}$. $S'_{c8}$ may correspond to a time point tea (e.g., an average time point) within a time period in which $S_{c8}$ and $S_{c9}$ are acquired.

Taking the second MR data set $S'_{c1}$ as an example, the processing device 120 may determine $S'_{c1}$ based on Equation (7) below:

$$S'_{c1} = \frac{S_{c2}(\alpha_2, TR_2)}{S_{c1}(\alpha_1, TR_1)} = \frac{\sin(\alpha_2)}{\sin(\alpha_1)} \cdot \frac{1-E_2}{1-E_1} \cdot \frac{1-E_1\cos(\alpha_1)}{1-E_2\cos(\alpha_2)}. \quad (7)$$

In some embodiments, to determine the second MR data set $S'_{c1}$, there is no limit of the order of the division of the adjacent first MR data sets $S_{c1}$ and $S_{c2}$. The processing device 120 may also determine $S'_{c1}$ based on Equation (8) below:

$$S'_{c1} = \frac{S_{c1}(\alpha_1, TR_1)}{S_{c2}(\alpha_2, TR_2)} = \frac{\sin(\alpha_1)}{\sin(\alpha_2)} \cdot \frac{1-E_1}{1-E_2} \cdot \frac{1-E_2\cos(\alpha_2)}{1-E_1\cos(\alpha_1)}. \quad (8)$$

$S'_{c2}$-$S'_{c8}$ may be determined based on an approach similar to Equation (7) or Equation (8).

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

FIGS. 8A-8C are schematic diagrams illustrating exemplary acquisition of a plurality of first MR data sets according to some embodiments of the present disclosure.

As shown in FIG. 8A, the processing device 120 may obtain a plurality of first MR data sets $S_{d1}$-$S_{d9}$. $S_{d1}$-$S_{d9}$ may be acquired in chronological order. $S_{d1}$-$S_{d9}$ may be acquired based on two different flip angles ($\alpha_1$ and $\alpha_2$) and the same TR. Each of $S_{d1}$-$S_{d9}$ may correspond to the same TR and one of $\alpha_1$ and $\alpha_2$. $S_{d1}$ corresponding to $\alpha_1$ may be acquired before $S_{d2}$-$S_{d9}$ corresponding to a 2.

As shown in FIG. 8A, the processing device 120 may determine a division of $S_{d1}$ and $S_{d2}$ to determine a second MR data set $S'_{d1}$. $S'_{d1}$ may correspond to a time point $t_{d1}$ within a time period in which $S_{d2}$ is acquired. The processing device 120 may determine a division of $S_{d1}$ and $S_{d2}$ to determine a second MR data set $S'_{d2}$. $S'_{d2}$ may correspond to a time point $t_{d2}$ within a time period in which $S_{d3}$ is acquired. The processing device 120 may determine a division of $S_{d1}$ and $S_{d4}$ to determine a second MR data set $S'_{d3}$. $S'_{d3}$ may correspond to a time point $t_{d3}$ within a time period in which $S_{d4}$ is acquired. The processing device 120 may determine a division of $S_{d1}$ and $S_{d5}$ to determine a second MR data set $S'_{d4}$. $S'_{d4}$ may correspond to a time point $t_{d4}$ within a time period in which $S_{d5}$ is acquired. The processing device 120 may determine a division of $S_{d1}$ and $S_{d6}$ to determine a second MR data set $S'_{d5}$. $S'_{d5}$ may correspond to a time point $t_{d5}$ within a time period in which $S_{d6}$ is acquired. The processing device 120 may determine a division of $S_{d1}$ and $S_{d7}$ to determine a second MR data set $S'_{d6}$. $S'_{d6}$ may correspond to a time point $t_{d6}$ within a time period in which $S_{d7}$ is acquired. The processing device 120 may determine a division of $S_{d1}$ and $S_{d8}$ to determine a second MR data set $S'_{d7}$. $S'_{d7}$ may correspond to a time point $t_{d7}$ within a time period in which $S_{d8}$ is acquired. The processing device 120 may determine a division of $S_{d1}$ and $S_{d9}$ to determine a second MR data set $S'_{d8}$. $S'_{d8}$ may correspond to a time point $t_{d8}$ within a time period in which $S_{d9}$ is acquired.

Taking the second MR data set $S'_{d1}$ as an example, the processing device 120 may determine $S'_{d1}$ based on Equation (9) below:

$$S'_{d1} = \frac{S_{d2}(\alpha_2, TR)}{\overline{S(\alpha_1, TR)}}, \quad (9)$$

wherein $\overline{S(\alpha_1, TR)}$ refers to an average of the first MR data sets corresponding to $\alpha_1$. If there is only one first MR data set corresponding to $\alpha_1$ ($S_{d1}$ shown in FIG. 8A), $\overline{S(\alpha_1, TR)} = S_{d1}(\alpha_1, TR)$. If there is two or more first MR data sets corresponding to $\alpha_1$, e.g., represented as $S_{d1}(\alpha_1, TR), \ldots, S_{din}(\alpha_1, TR)$, $\overline{S(\alpha_1, TR)} = [S_{d11}(\alpha_1, TR) + S_{d12}(\alpha_1, TR) + \ldots + S_{d1n}(\alpha_1, TR)]/n$ (n is an integer that is greater than 1). In some embodiments, to determine the second MR data set $S'_{d1}$, there is no limit of the order of the division of $\overline{S(\alpha_1, TR)}$ and $S_{d2}(\alpha_2, TR)$. The processing device 120 may also determine $S'_{d1}$ based on Equation (10) below:

$$S'_{d1} = \frac{\overline{S(\alpha_1, TR)}}{S_{d2}(\alpha_2, TR)}. \quad (10)$$

$S'_{d2}$-$S'_{d8}$ may be determined based on an approach similar to Equation (9) or Equation (10).

In some embodiments, the number (count) of first MR data sets corresponding to $\alpha_1$ may be one or more. In some embodiments, the first MR data sets after the first MR data set(s) corresponding to $\alpha_1$ may also be acquired based on two or more values of flip angle.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. As shown in FIG. 8B, the processing device 120 may obtain a plurality of first MR data sets $S_{e1}$-$S_{e9}$. $S_{e1}$-$S_{e9}$ may be acquired in chronological order. $S_{e1}$-$S_{e9}$ may be acquired based on two different values of TR ($TR_1$ and $TR_2$) and the same flip angle $\alpha$. Each of $S_{e1}$-$S_{e9}$ may correspond to the same flip angle $\alpha$ and one of $TR_1$ and $TR_2$. $S_{e1}$ corresponding to $TR_1$ may be acquired before $S_{e2}$-$S_{e9}$ corresponding to $TR_2$.

As shown in FIG. 8B, the processing device 120 may determine a division of $S_{e1}$ and $S_{e2}$ to determine a second MR data set $S'_{e1}$. S'e1 may correspond to a time point $t_{e1}$ within a time period in which $S_{e2}$ is acquired. The processing device 120 may determine a division of $S_{e1}$ and $S_{e2}$ to determine a second MR data set $S'_{e2}$. $S'_{e2}$ may correspond to a time point tee within a time period in which $S_{e3}$ is acquired. The processing device 120 may determine a division of $S_{e1}$ and $S_{e4}$ to determine a second MR data set $S'_{e3}$. $S'_{e3}$ may correspond to a time point $t_{e3}$ within a time period in which $S_{e4}$ is acquired. The processing device 120 may determine a division of $S_{e1}$ and $S_{e5}$ to determine a second MR data set $S'_{e4}$. $S'_{e4}$ may correspond to a time point $t_{e4}$ within a time period in which $S_{e5}$ is acquired. The processing device 120 may determine a division of $S_{e1}$ and $S_{e6}$ to determine a second MR data set $S'_{e5}$. $S'_{e5}$ may correspond to a time point $t_{e5}$ within a time period in which $S_{e6}$ is acquired. The processing device 120 may determine a division of $S_{e1}$ and $S_{e7}$ to determine a second MR data set $S'_{e6}$. $S'_{e6}$ may correspond to a time point $t_{e6}$ within a time period in which $S_{e7}$ is acquired. The processing device 120 may determine a division of $S_{e1}$ and $S_{e8}$ to determine a second MR data set $S'_{e7}$. $S'_{e7}$ may correspond to a time point $t_{e7}$ within a time period in which $S_{e8}$ is acquired. The processing device 120 may determine a division of $S_{e1}$ and $S_{e9}$ to determine a second MR data set $S'_{e8}$. $S'_{e8}$ may correspond to a time point tea within a time period in which $S_{e9}$ is acquired.

Taking the second MR data set $S'_{e1}$ as an example, the processing device 120 may determine $S'_{e1}$ based on Equation (11) below:

$$S'_{e1} = \frac{S_{e2}(\alpha, TR_2)}{\overline{S(\alpha, TR_1)}}, \quad (11)$$

wherein $\overline{S(\alpha_1, TR_1)}$ refers to an average of the first MR data sets corresponding to $TR_1$. If there is only one first MR data set corresponding to $TR_1$ ($S_{e1}$ shown in FIG. 8B), $\overline{S(\alpha, TR_1)} = S_{e1}(\alpha, TR_1)$. If there is two or more first MR data sets corresponding to $TR_1$, e.g., represented as $S_{e11}(\alpha, TR_1)$, $S_{e12}(\alpha, TR_1)$, . . . , $S_{e1n}(\alpha, TR_1)$, $\overline{S(\alpha, TR_1)} = [S_{e11}(\alpha, TR_1) + S_{e12}(\alpha, TR_1) + \ldots + S_{e1n}(\alpha, TR_1)]/n$ (n is an integer that is greater than 1).

In some embodiments, to determine the second MR data set $S'_{e1}$, there is no limit of the order of the division of $\overline{S(\alpha, TR_1)}$ and $S_{e2}(\alpha, TR_2)$. The processing device 120 may also determine $S'_{e1}$ based on Equation (12) below:

$$S'_{e1} = \frac{\overline{S(\alpha_1, TR_1)}}{S_{e2}(\alpha, TR_2)}. \quad (12)$$

$S'_{e2}$-$S'_{e8}$ may be determined based on an approach similar to Equation (11) or Equation (12).

In some embodiments, the number (count) of first MR data sets corresponding to $TR_1$ may be one or more. In some embodiments, the first MR data sets after the first MR data set(s) corresponding to $TR_1$ may also be acquired based on two or more values of TR.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

As shown in FIG. 8C, the processing device 120 may obtain a plurality of first MR data sets $S_{f1}$-$S_{f9}$. $S_{f1}$-$S_{f9}$ may be acquired in chronological order. $S_{f1}$-$S_{f9}$ may be acquired based on two different values of TR ($TR_1$ and $TR_2$) and two different values of flip angle ($\alpha_1$ and $\alpha_2$). Each of $S_{f1}$-$S_{f9}$ may correspond to one of $\alpha_1$ and $\alpha_2$ and one of $TR_1$ and $TR_2$. For example, as shown in FIG. 8C, to acquire $S_{f1}$-$S_{f9}$, $S_{f1}$ corresponding to $TR_1$ and $\alpha_1$ may be acquired before $S_{f2}$-$S_{f9}$ corresponding to $TR_2$ and $\alpha_2$. As another example, to acquire $S_{f1}$-$S_{f9}$, $S_{f1}$ corresponding to $TR_2$ and $\alpha_2$ may be acquired before $S_{f2}$-$S_{f9}$ corresponding to $TR_1$ and $\alpha_1$. As still another example, to acquire $S_{f1}$-$S_{f9}$, $S_{f1}$ corresponding to $TR_1$ and $\alpha_2$ may be acquired before $S_{f2}$-$S_{f9}$ corresponding to $TR_2$ and $\alpha_1$. As further another example, to acquire $S_{f1}$-$S_{f9}$, $S_{f1}$ corresponding to $TR_2$ and $\alpha_1$ may be acquired before $S_{f2}$-$S_{f9}$ corresponding to $TR_1$ and $\alpha_2$.

As shown in FIG. 8C, the processing device 120 may determine a division of $S_{f1}$ and $S_{f2}$ to determine a second MR data set $S'_{f1}$. $S'_{f1}$ may correspond to a time point $t_{f1}$ within a time period in which $S_{f2}$ is acquired. The processing device 120 may determine a division of $S_{f1}$ and $S_{f2}$ to determine a second MR data set $S'_{f2}$. $S'_{f2}$ may correspond to a time point $t_{f2}$ within a time period in which $S_{f3}$ is acquired. The processing device 120 may determine a division of $S_{f1}$ and Sm to determine a second MR data set $S'_{f3}$. $S'_{f3}$ may correspond to a time point $t_{f3}$ within a time period in which Sm is acquired. The processing device 120 may determine a division of $S_{f1}$ and $S_{f5}$ to determine a second MR data set $S'_{f4}$. $S'_{f4}$ may correspond to a time point $t_{f4}$ within a time period in which $S_{f5}$ is acquired. The processing device 120 may determine a division of $S_{f1}$ and $S_{f6}$ to determine a second MR data set $S'_{f5}$. $S'_{f5}$ may correspond to a time point $t_{f5}$ within a time period in which $S_{f6}$ is acquired. The processing device 120 may determine a division of $S_{f1}$ and $S_{f7}$ to determine a second MR data set $S'_{f6}$. $S'_{f6}$ may correspond to a time point $t_{f6}$ within a time period in which $S_{f7}$ is acquired. The processing device 120 may determine a division of $S_{f1}$ and $S_{f8}$ to determine a second MR data set $S'_{f7}$. $S'_{f7}$ may correspond to a time point $t_{f7}$ within a time period in which $S_{f8}$ is acquired. The processing device 120 may determine a division of $S_{f1}$ and $S_{f9}$ to determine a second MR data set $S'_{f8}$. $S'_{f8}$ may correspond to a time point $t_{f8}$ within a time period in which $S_{f9}$ is acquired.

Taking the second MR data set $S'_{f1}$ as an example, the processing device 120 may determine $S'_{f1}$ based on Equation (13) below:

$$S'_{f1} = \frac{S_{f2}(\alpha_2, TR_2)}{\overline{S(\alpha_1 TR_1)}}, \quad (13)$$

wherein $\overline{S(\alpha_1, TR_1)}$ refers to an average of the first MR data sets corresponding to $TR_1$ and $\alpha_1$. If there is only one first MR data set corresponding to $TR_1$ and $\alpha_1$ ($S_{f1}$ shown in FIG. 8C), $\overline{S(\alpha_1, TR_1)} = S_{f1}(\alpha_1, TR_1)$. If there is two or more first MR data sets corresponding to $TR_1$ and $\alpha_1$, e.g., represented as $S_{f11}(\alpha_1, TR_1)$, $S_{f12}(\alpha_1, TR_1)$, . . . , $S_{f1n}(\alpha_1, TR_1)$, $\overline{S(\alpha_1, TR_1)} = [S_{f11}(\alpha_1, TR_1) + S_{f12}(\alpha_1, TR_1) + \ldots + S_{f1n}(\alpha_1, TR_1)]/n$ (n is an integer that is greater than 1).

In some embodiments, to determine the second MR data set $S'_{f1}$, there is no limit of the order of the division of $\overline{S(\alpha_1, TR_1)}$ and $S_{f2}(\alpha_2, TR_2)$. The processing device 120 may also determine $S'_{f1}$ based on Equation (14) below:

$$S'_{f1} = \frac{\overline{S(\alpha_1, TR_1)}}{S_{f2}(\alpha_2, TR_2)}. \quad (14)$$

$S'_{f2}$-$S'_{f8}$ may be determined based on an approach similar to Equation (13) or Equation (14).

In some embodiments, the number (count) of first MR data sets corresponding to $\alpha_1$ and $TR_1$ may be one or more. In some embodiments, the first MR data sets after the first MR data set(s) corresponding to $\alpha_1$ and $TR_1$ may also be acquired based on two or more values of flip angle and two or more values of TR.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

In some embodiments, as shown in FIGS. 7A-8C, when the plurality of first MR data sets are acquired based on an injection of a contrast agent into the ROI, at least one of the plurality of first MR data sets (e.g., $S_{a1}$-$S_{a3}$ in FIG. 7A, $S_{b1}$-$S_{b3}$ in FIG. 7B, $S_{c1}$-$S_{c3}$ in FIG. 7C, $S_{d1}$-$S_{d3}$ in FIG. 8A, $S_{e1}$-$S_{e3}$ in FIG. 8B, $S_{f1}$-$S_{f3}$ in FIG. 8C) may be acquired before the injection of the contrast agent into the ROI, and the rest of the plurality of first MR data sets (e.g., $S_{a4}$-$S_{a9}$ in FIG. 7A, $S_{b4}$-$S_{b9}$ in FIG. 7B, $S_{c4}$-$S_{c9}$ in FIG. 7C, $S_{d4}$-$S_{d9}$ in FIG. 8A, $S_{e4}$-$S_{e9}$ in FIG. 8B, $S_{f4}$-$S_{f9}$ in FIG. 8C) may be acquired after the injection of the contrast agent.

In some embodiments, as shown in FIGS. 8A-8C, at least one of the plurality of first MR data sets corresponding to a first value of the two or more value of the scan parameter may be collected before the rest of the plurality of first MR data sets corresponding to the rest of the two or more values of the scan parameter. A first portion (e.g., $S_{d2}$-$S_{d3}$ in FIG. 8A, $S_{e2}$-$S_{e3}$ in FIG. 8B, $S_{f2}$-$S_{f3}$ in FIG. 8C) of the rest of the plurality of first MR data sets may be acquired before the injection of the contrast agent into the ROI, and a second portion (e.g., $S_{a4}$-$S_{a9}$ in FIG. 7A, $S_{b4}$-$S_{b9}$ in FIG. 7B, $S_{c4}$-$S_{c9}$ in FIG. 7C, $S_{d4}$-$S_{d9}$ in FIG. 8A, $S_{e4}$-$S_{e9}$ in FIG. 8B, $S_{f4}$-$S_{f9}$ in FIG. 8C) of the rest of the plurality of first MR data sets may be acquired after the injection of the contrast agent.

In some embodiments, the processing device 120 may determine the plurality of second MR data sets using a multi-dimensional integration (MDI) strategy. For example, the processing device 120 may construct an $L^2$-norm minimization problem based on Equation (15) below to determine a second MR data set S':

$$\min_{S'} \sum_1^{N_c} \|S_i - S_i \cdot S'\|_2^2, \quad (15)$$

wherein $N_c$ refers to the number (count) of channels for receiving echo signals; and $S_i$ refers to one or more first MR data sets related to the second MR data set S'. For example, if the second MR data set S' refers to $S'_{a1}$ defined based on Equation (3) or Equation (4), $S_i$ refers to $S_{a1}(\alpha_1,TR)$ or $S_{a2}(\alpha_2,TR)$. As another example, if the second MR data set S' refers to $S'_{b1}$ defined based on Equation (5) or Equation (6), $S_i$ refers to $S_{b2}(\alpha,TR_2)$ or $S_{b1}(\alpha,TR_1)$. As still another example, if the second MR data set S' refers to $S'_{c1}$ defined based on Equation (7) or Equation (8), $S_i$ refers to $S_{c2}(\alpha_2, TR_2)$ or $S_{c1}(\alpha_1,TR_1)$. As further another example, if the second MR data set S' refers to $S'_{d1}$ defined based on Equation (9) or Equation (10), $S_i$ refers to $S_{d2}(\alpha_2, TR)$ or $\overline{S(\alpha_1,TR)}$. As yet another example, if the second MR data set S' refers to $S'_{e1}$ defined based on Equation (11) or Equation (12), $S_i$ refers to $S_{e2}(\alpha,TR_2)$ or $\overline{S(\alpha,TR_1)}$. As yet another example, if the second MR data set S' refers to $S'_{f1}$ defined based on Equation (13) or Equation (14), $S_i$ refers to $S_{f2}(\alpha_2, TR_2)$ or $\overline{S(\alpha_1,TR_1)}$.

The processing device 120 may determine the second MR data set S' by solving Equation (15) using, e.g., least-square optimization.

Details regarding MDI strategy may be found in the reference "Ye Y, Lyu J, Sun W, et al. A multi-dimensional integration (MDI) strategy for MR T2*mapping. NMR Biomed 2021; 34 (7): e4529" and/or the reference "Ye Y, Lyu J, Hu Y, Zhang Z, Xu J, Zhang W. Augmented T1 weighted (aT1 W) contrast using dual flip angles acquisition. Proceedings 29th Scientific Meeting, International Society for Magnetic Resonance in Medicine; 2021. p. 2606," each of which is incorporated herein by reference.

In some embodiments, the processing device 120 may determine the plurality of second MR data sets using other algorithm.

In the plurality of first MR data sets, besides T1 information, there are also non-T1 factors, which may introduce errors and biases to signal analysis, e.g., image reconstruction, physiological analysis, etc. The one or more non-T1 factors may depend on the configuration of the MRI device 110 and tissue properties of the ROI. For example, the one or more non-T1 factors may include T2*, a receiving coil sensitivity, an echo time (TE), a proton density of the ROI, or the like, or any combination thereof.

As illustrated in FIGS. 7A-8C, by determining a second MR data set based on at least two of the plurality of first MR data sets, the one or more non-T1 factors (e.g., $M_0$ in Equation (2)) in the at least two of the plurality of first MR data sets may be offset, so that the one or more non-T1 factors have less effect on the plurality of second MR data sets than the plurality of first MR data sets, thereby resulting a stronger contrast in the T1 weighted images, and making the subsequent physiological analysis more accurate. In addition, due to the interference of non-T1 factors is eliminated or alleviated in the plurality of second MR data sets, the plurality of second MR data sets may be more sensitive to the T1 shortening effect caused by the contrast agent. So low-dose contrast agent can be used to reduce the cost and the potential impact of the contrast agent on the human body.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, the Equations provided above are illustrative examples and can be modified in various ways. For example, one or more coefficients in an Equation may be omitted, and/or the Equation may further include one or more additional coefficients.

Figure 10A:
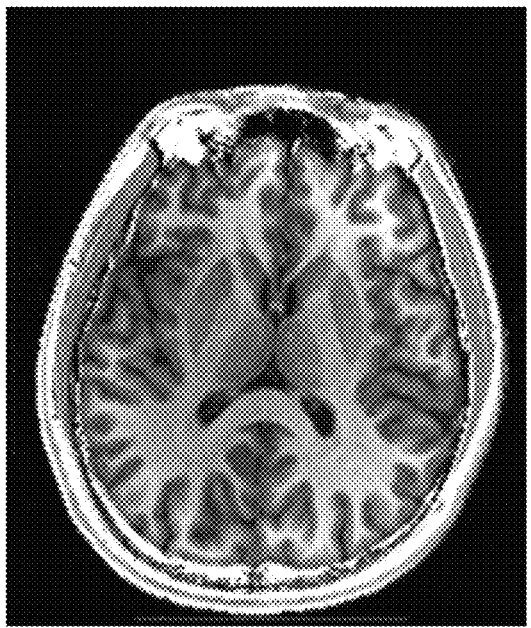
FIG. 10A is a schematic diagram illustrating an exemplary T1 weighted image generated based on a second MR data set according to some embodiments of the present disclosure.
Figure 10B:
FIG. 10B is a schematic diagram illustrating an exemplary T1 weighted image generated based on a first MR data set.

FIG. 10A is a schematic diagram illustrating an exemplary T1 weighted image 1000-1 generated based on a second MR data set (e.g., $S'_{a1}$ in FIG. 7A) according to some embodiments of the present disclosure. FIG. 10B is a schematic diagram illustrating an exemplary T1 weighted image 1000-2 generated based on a first MR data set (e.g., $S_{a1}$ or $S_{a2}$ in FIG. 7A). As shown in FIG. 7A and FIG. 7B, the T1 weighted image 1000-1 has a stronger contrast than the T1 weighted image 1000-2.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

What is claimed is:

1. A method for magnetic resonance imaging (MRI) implemented on a computing device having at least one processing device and at least one storage device, the method comprising:
   obtaining a plurality of first magnetic resonance (MR) data sets related to a region of interest (ROI) of a subject, the plurality of first MR data sets being collected based on two or more different values of a scan parameter;
   determining a plurality of second MR data sets based on the plurality of first MR data sets, each of the plurality of second MR data sets corresponding to at least two of the plurality of first MR data sets; and
   generating, based on the plurality of second MR data sets, a plurality of T1 weighted images of the ROI each of which corresponds to a target time point.

2. The method of claim 1, wherein the at least two of the plurality of first MR data sets corresponding to the each of the plurality of second MR data sets correspond to two of the two or more different values of the scan parameter.

3. The method of claim 2, wherein determining the plurality of second MR data sets based on the plurality of first MR data sets includes:
   for one of the plurality of second MR data sets,
      obtaining at least one first MR data set related to a first value of the scan parameter;
      obtaining at least one first MR data set related to a second value of the scan parameter;

performing division based on the at least two of the plurality of first MR data sets related to the first value and the second value of the scan parameter.

4. The method of claim 1, wherein the scan parameter includes at least one of a flip angle or a repetition time (TR).

5. The method of claim 4, wherein
the plurality of first MR data sets are collected based on
two or more different values of the flip angle and a fixed value of the TR;
two or more different values of the TR and a fixed value of the flip angle; or
two or more different values of the flip angle and two or more different values of the TR; and
the plurality of first MR data sets are collected so that any two adjacent first MR data sets correspond to different values of at least one of the flip angle or the TR.

6. The method of claim 5, wherein determining the plurality of second MR data sets based on the plurality of first MR data sets includes:
for each of the plurality of second MR data sets, determining the second MR data set by performing division between two adjacent first MR data sets.

7. The method of claim 4, wherein
the plurality of first MR data sets are collected based on
two or more different values of the flip angle and a fixed value of the TR; or
two or more different values of the TR and a fixed value of the flip angle; and
at least one of the plurality of first MR data sets corresponding to a first value of the two or more values of the flip angle or the TR is collected before the rest of the plurality of first MR data sets corresponding to the rest of the two or more values of the flip angle or the TR; or
the plurality of first MR data sets are collected based on
two or more different values of the flip angle and two or more different values of the TR; and
at least one of the plurality of first MR data sets corresponding to a first value of the two or more values of the flip angle and a first value of the two or more values of the TR is collected before the rest of the plurality of first MR data sets corresponding to the rest of the two or more values of the flip angle and the rest of the two or more values of the TR.

8. The method of claim 7, wherein determining the plurality of second MR data sets based on the plurality of first MR data sets includes:
determining an average of the at least one of the plurality of first MR data sets;
for each of the plurality of second MR data sets, determining the second MR data set by performing division between the average and one of the rest of the plurality of first MR data sets.

9. The method of claim 1, further comprising:
performing T1 mapping based on the plurality of first MR data sets.

10. A system for magnetic resonance imaging (MRI), comprising:
at least one storage device including a set of instructions; and
at least one processor in communication with the at least one storage device, wherein when executing the set of instructions, the at least one processor is directed to cause the system to perform operations including:
obtaining a plurality of first magnetic resonance (MR) data sets related to a region of interest (ROI) of a subject, the plurality of first MR data sets being collected based on two or more different values of a scan parameter;
determining a plurality of second MR data sets based on the plurality of first MR data sets, each of the plurality of second MR data sets corresponding to at least two of the plurality of first MR data sets; and
generating, based on the plurality of second MR data sets, a plurality of T1 weighted images of the ROI each of which corresponds to a target time point.

11. The system of claim 10, wherein the at least two of the plurality of first MR data sets corresponding to the each of the plurality of second MR data sets correspond to two of the two or more different values of the scan parameter.

12. The system of claim 11, wherein determining the plurality of second MR data sets based on the plurality of first MR data sets includes:
for one of the plurality of second MR data sets,
obtaining at least one first MR data set related to a first value of the scan parameter;
obtaining at least one first MR data set related to a second value of the scan parameter;
performing division based on the at least two of the plurality of first MR data sets related to the first value and the second value of the scan parameter.

13. The system of claim 10, wherein the scan parameter includes at least one of a flip angle or a repetition time (TR).

14. The system of claim 13, wherein
the plurality of first MR data sets are collected based on
two or more different values of the flip angle and a fixed value of the TR;
two or more different values of the TR and a fixed value of the flip angle; or
two or more different values of the flip angle and two or more different values of the TR; and
the plurality of first MR data sets are collected so that any two adjacent first MR data sets correspond to different values of at least one of the flip angle or the TR.

15. The system of claim 14, wherein determining the plurality of second MR data sets based on the plurality of first MR data sets includes:
for each of the plurality of second MR data sets, determining the second MR data set by performing division between two adjacent first MR data sets.

16. The system of claim 13, wherein
the plurality of first MR data sets are collected based on
two or more different values of the flip angle and a fixed value of the TR; or
two or more different values of the TR and a fixed value of the flip angle; and
at least one of the plurality of first MR data sets corresponding to a first value of the two or more values of the flip angle or the TR is collected before the rest of the plurality of first MR data sets corresponding to the rest of the two or more values of the flip angle or the TR; or
the plurality of first MR data sets are collected based on
two or more different values of the flip angle and two or more different values of the TR; and
at least one of the plurality of first MR data sets corresponding to a first value of the two or more values of the flip angle and a first value of the two or more values of the TR is collected before the rest of the plurality of first MR data sets corresponding to the rest of the two or more values of the flip angle and the rest of the two or more values of the TR.

17. The system of claim 16, wherein determining the plurality of second MR data sets based on the plurality of first MR data sets includes:
- determining an average of the at least one of the plurality of first MR data sets;
- for each of the plurality of second MR data sets, determining the second MR data set by performing division between the average and one of the rest of the plurality of first MR data sets.

18. The system of claim 10, wherein the at least one processor is directed to cause the system to perform the operations further including:
- performing T1 mapping based on the plurality of first MR data sets.

19. The system of claim 18, wherein the at least one processor is directed to cause the system to perform the operations further including:
- estimating a contrast agent concentration corresponding to each target time point based on the plurality of T1 weighted images and the T1 mapping; and
- performing physiological analysis of the ROI based on the contrast agent concentration corresponding to each target time point.

20. A non-transitory computer readable medium, comprising at least one set of instructions, wherein when executed by one or more processors of a computing device, the at least one set of instructions causes the computing device to perform a method, the method comprising:
- obtaining a plurality of first magnetic resonance (MR) data sets related to a region of interest (ROI) of a subject, the plurality of first MR data sets being collected based on two or more different values of a scan parameter;
- determining a plurality of second MR data sets based on the plurality of first MR data sets, each of the plurality of second MR data sets corresponding to at least two of the plurality of first MR data sets; and
- generating, based on the plurality of second MR data sets, a plurality of T1 weighted images of the ROI each of which corresponds to a target time point.

\* \* \* \* \*